(12) United States Patent
Alcott et al.

(10) Patent No.: US 11,702,761 B2
(45) Date of Patent: *Jul. 18, 2023

(54) CONCENTRIC FLOW REACTOR

(71) Applicant: AlignedBio AB, Lund (SE)

(72) Inventors: Greg Alcott, Lund (SE); Martin Magnusson, Malmo (SE); Olivier Postel, Villach (AT); Knut Deppert, Lund (SE); Lars Samuelson, Malmo (SE); Jonas Ohlsson, Malmo (SE)

(73) Assignee: ALIGNEDBIO AB, Lund (SE)

( * ) Notice: Subject to any disclaimer, the term of this patent is extended or adjusted under 35 U.S.C. 154(b) by 111 days.

This patent is subject to a terminal disclaimer.

(21) Appl. No.: 17/148,089

(22) Filed: Jan. 13, 2021

(65) Prior Publication Data

US 2021/0130979 A1 May 6, 2021

Related U.S. Application Data

(63) Continuation of application No. 16/250,191, filed on Jan. 17, 2019, now Pat. No. 10,920,340, which is a
(Continued)

(51) Int. Cl.
*C30B 25/14* (2006.01)
*C30B 23/00* (2006.01)
(Continued)

(52) U.S. Cl.
CPC ............ *C30B 25/14* (2013.01); *C23C 16/301* (2013.01); *C23C 16/45504* (2013.01);
(Continued)

(58) Field of Classification Search
CPC ..... C30B 25/14; C30B 25/005; C30B 23/007; C23C 16/30; C23C 16/45504
See application file for complete search history.

(56) References Cited

U.S. PATENT DOCUMENTS 6,054,041 A 4/2000 Ellis et al.
6,179,913 B1 1/2001 Solomon et al.
(Continued)

FOREIGN PATENT DOCUMENTS

CN 1548369 A 11/2004
CN 1681975 A 10/2005
(Continued)

OTHER PUBLICATIONS

Reexamination Notice issued by the Patent Reexamination Board for Chinese Patent Application No. 201711114531.3, dated Apr. 24, 2022, 6 pages.
(Continued)

*Primary Examiner* — Matthew J Song
(74) *Attorney, Agent, or Firm* — The Marbury Law Group PLLC

(57) ABSTRACT

A gas phase nanowire growth apparatus including a reaction chamber, a first input and a second input. The first input is located concentrically within the second input and the first and second input are configured such that a second fluid delivered from the second input provides a sheath between a first fluid delivered from the first input and a wall of the reaction chamber.

8 Claims, 17 Drawing Sheets

Related U.S. Application Data continuation of application No. 15/410,078, filed on Jan. 19, 2017, now Pat. No. 10,196,755, which is a continuation of application No. 14/403,427, filed as application No. PCT/SE2013/050594 on May 24, 2013, now Pat. No. 9,574,286.

(60) Provisional application No. 61/651,724, filed on May 25, 2012.

(51) Int. Cl.
| | |
|---|---|
| C30B 29/60 | (2006.01) |
| C30B 25/02 | (2006.01) |
| C30B 29/06 | (2006.01) |
| C30B 29/40 | (2006.01) |
| C30B 25/00 | (2006.01) |
| C30B 11/00 | (2006.01) |
| C30B 11/12 | (2006.01) |
| C30B 29/62 | (2006.01) |
| C23C 16/30 | (2006.01) |
| C23C 16/455 | (2006.01) |
| C30B 29/42 | (2006.01) |

(52) U.S. Cl.
CPC ...... *C23C 16/45519* (2013.01); *C30B 11/003* (2013.01); *C30B 11/006* (2013.01); *C30B 11/12* (2013.01); *C30B 23/007* (2013.01); *C30B 25/005* (2013.01); *C30B 25/025* (2013.01); *C30B 29/06* (2013.01); *C30B 29/40* (2013.01); *C30B 29/403* (2013.01); *C30B 29/42* (2013.01); *C30B 29/60* (2013.01); *C30B 29/62* (2013.01); *Y10T 117/102* (2015.01)

(56) References Cited

U.S. PATENT DOCUMENTS

| | | |
|---|---|---|
| 7,115,230 B2 | 10/2006 | Sundararajan et al. |
| 8,563,325 B1 | 10/2013 | Bartsch et al. |
| 9,574,286 B2 | 2/2017 | Alcott et al. |
| 10,196,755 B2 | 2/2019 | Alcott et al. |
| 10,920,340 B2 * | 2/2021 | Alcott ............ C23C 16/301 |
| 2003/0192471 A1 | 10/2003 | Juergensen et al. |
| 2004/0005723 A1 | 1/2004 | Empedocles et al. |
| 2004/0075464 A1 | 4/2004 | Samuelson et al. |
| 2005/0054004 A1 | 3/2005 | Alivisatos et al. |
| 2005/0170089 A1 | 8/2005 | Lashmore et al. |
| 2005/0230240 A1 | 10/2005 | Dubrovsky et al. |
| 2007/0034155 A1 | 2/2007 | Takatsu |
| 2007/0107654 A1 | 5/2007 | Motakef et al. |
| 2008/0188064 A1 | 8/2008 | Samuelson et al. |
| 2011/0309306 A1 | 12/2011 | Zhou et al. |
| 2013/0098288 A1 | 4/2013 | Samuelson et al. |
| 2017/0198409 A1 | 7/2017 | Alcott et al. |

FOREIGN PATENT DOCUMENTS

| | | |
|---|---|---|
| CN | 1745468 A | 3/2006 |
| CN | 1810640 A | 8/2006 |
| CN | 1850598 A | 10/2006 |
| CN | 1917120 A | 2/2007 |
| CN | 101111305 A | 1/2008 |
| CN | 101410950 A | 4/2009 |
| CN | 101681813 A | 3/2010 |
| CN | 101910050 A | 12/2010 |
| CN | 102170947 A | 8/2011 |
| CN | 102320594 A | 1/2012 |
| GB | 2436398 A | 9/2007 |
| JP | 2005041752 A | 2/2005 |
| JP | 2007504081 A | 3/2007 |
| JP | 2007527844 A | 10/2007 |
| WO | WO2004/004927 A2 | 1/2004 |
| WO | WO2004/038767 A2 | 5/2004 |
| WO | WO2007/010781 A1 | 1/2007 |
| WO | WO2011/078780 A1 | 6/2011 |
| WO | WO2011/142717 A1 | 11/2011 |
| WO | WO2011141717 A1 | 11/2011 |
| WO | WO2013/154490 A3 | 10/2013 |

OTHER PUBLICATIONS

Chinese Patent Office Communication, Reexamination and Invalidation Department of the Patent Office issued the Decision of Reexamination for Chinese Patent Application No. 201711114531. 3, dated Jul. 26, 2022, 10 pages.
International Search Report from European Patent Office for PCT/SE2013/050594, dated Sep. 5, 2013.
International Preliminary Report on Patentability, International Application No. PCT/SE2013/050594, dated Nov. 25, 2014.
Hara et al., "High-Rate Particle Growth Using GaCl and NH3 as Sources in Two-Stage Vapor-Phase Method for Synthesis of GaN Powders," Japanese Journal of Applied Physics, Japan Society of Applied Physics, Tokyo, Japan, vol. 42, No. 12A, Part 02, Dec. 2002.
Deppert et al., "InP Nanocrystals via Aerosol Route," 1997 Int. Conference on Indium Phosphide and Related Materials, Hyannis, MA, May 11-15, 1997, IEEE, pp. 79-82.
Nguyen et al., "InN p-i-n Nanowire Solar Cells on Si," IEEE Journal of Selected Topics in Quantum Electronics, vol. 17, No. 4, Jul. 2011, pp. 1062-1069.
Mangusson et al., "Gold Nanoparticles: Production, Reshaping, and Thermal Charging," Journal of Nanoparticle Research, vol. 1, No. 2, pp. 243-251.
Kim et al., "Understanding ion mobility and transport properties of aerosol nanowires", Journal of Aerosol Science, vol. 38, pp. 823-842 (2007).
U.S. Appl. No. 14/537,247, Office Action dated Mar. 28, 2016, 29 pgs.
EP Application No. 13 726 897.5, Office Communication dated Apr. 19, 2016, 4 pgs.
China Application No. 201380039432.7, Office Action dated Aug. 17, 2016, 20 pgs.
China Patent Application No. 201380039432.7, Search Report, dated Aug. 17, 2016, 4 pgs.
Korea Application No. 2014-7035424, Notice of Preliminary Rejection, dated Sep. 14, 2018, 7pgs.
China Application No. 201711114531.3, Office Action and Search Report, dated Jul. 30, 2018, 10pgs.
China Application No. 201380039432.7, Office Action dated Apr. 17, 2017, 3pgs.
Japan Application No. 2015-513974, Office Action dated Mar. 6, 2017, 3pgs.
Second Office Action from China National Intellectual Property Administration for Chinese Patent Application for Invention No. 201711114531.3, dated Mar. 11, 2019, 4 pages.
Third Office Action from China National Intellectual Property Administration for Chinese Patent Application for Invention No. 201711114531.3, dated Jan. 15, 2020, 8 pages.
Office Communication, Decision of Rejection, from China National Intellectual Property Administration for Chinese Patent Application for Invention No. 201711114531.3, dated May 7, 2020, 4 pages.

* cited by examiner

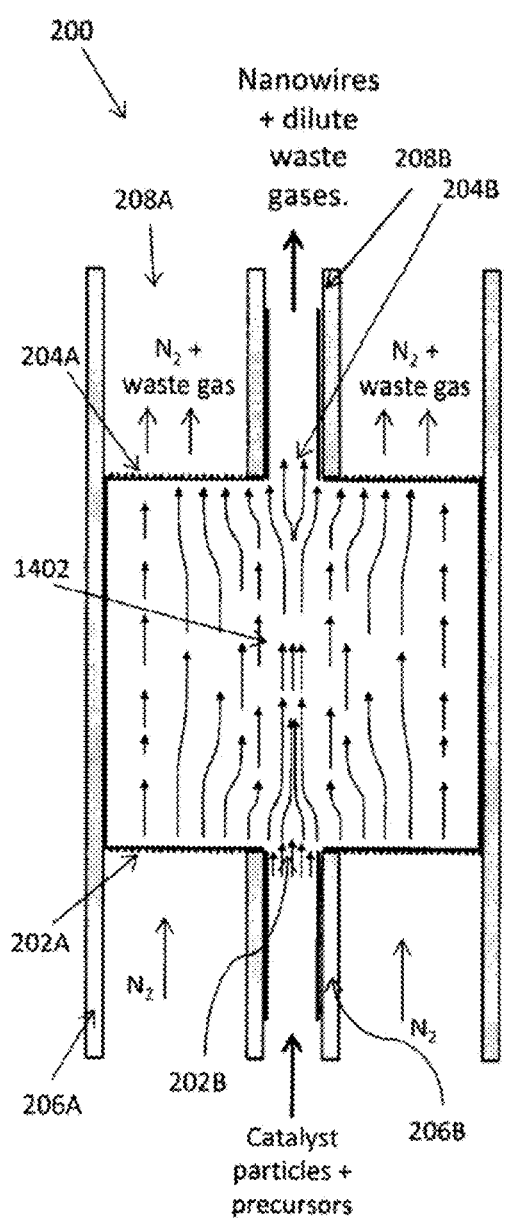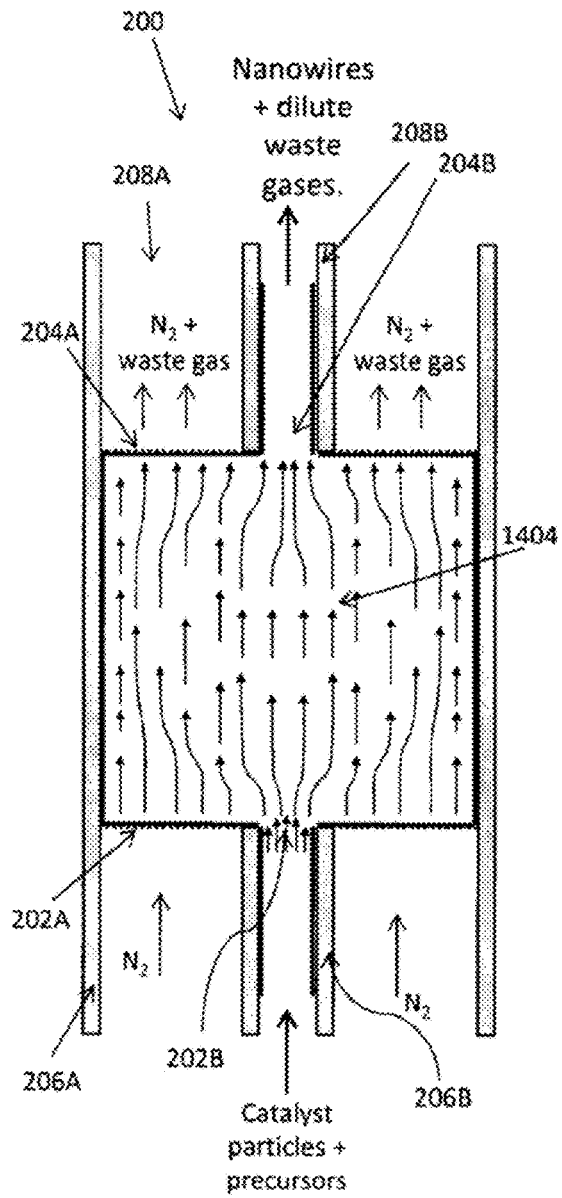
a. High Sheath flow with low core flow.
Fig. 2B
b. Low Sheath flow with high core flow.
Fig. 2C

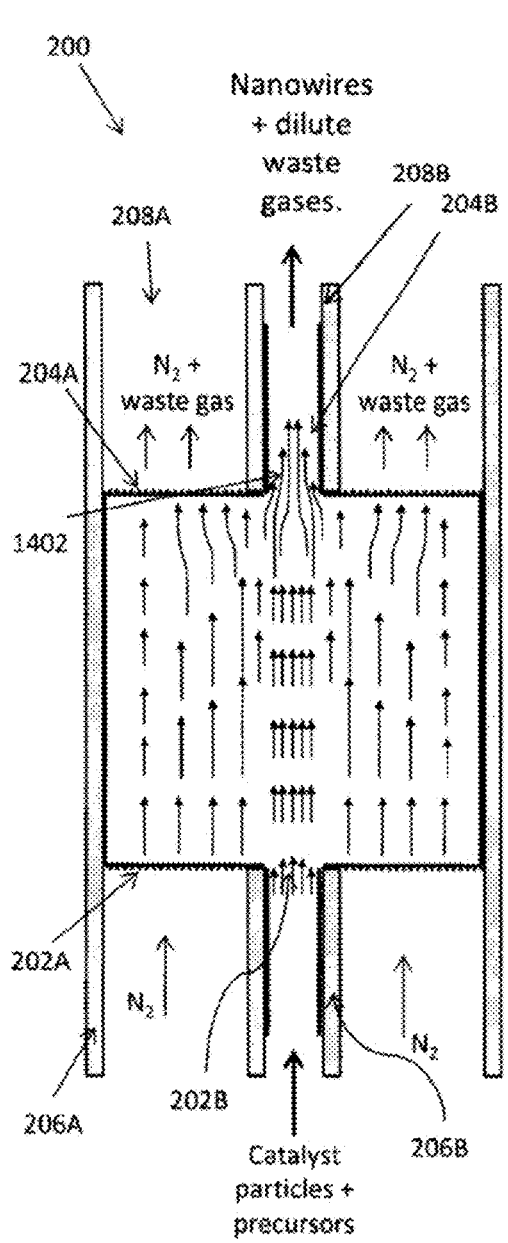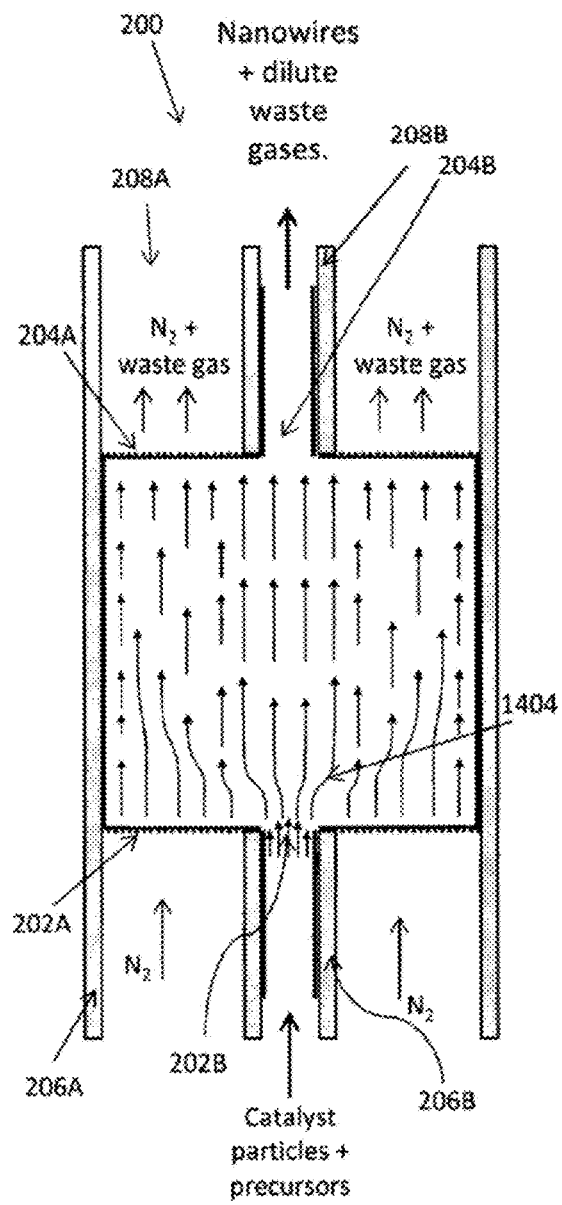
c. Sheath flow matched with core flow at inlet, low sheath flow relative to core flow at outlet.
Fig. 2D
d. Sheath flow low with respect to core flow at inlet, but matched with sheath flow at outlet.
Fig. 2E

Fig. 4A

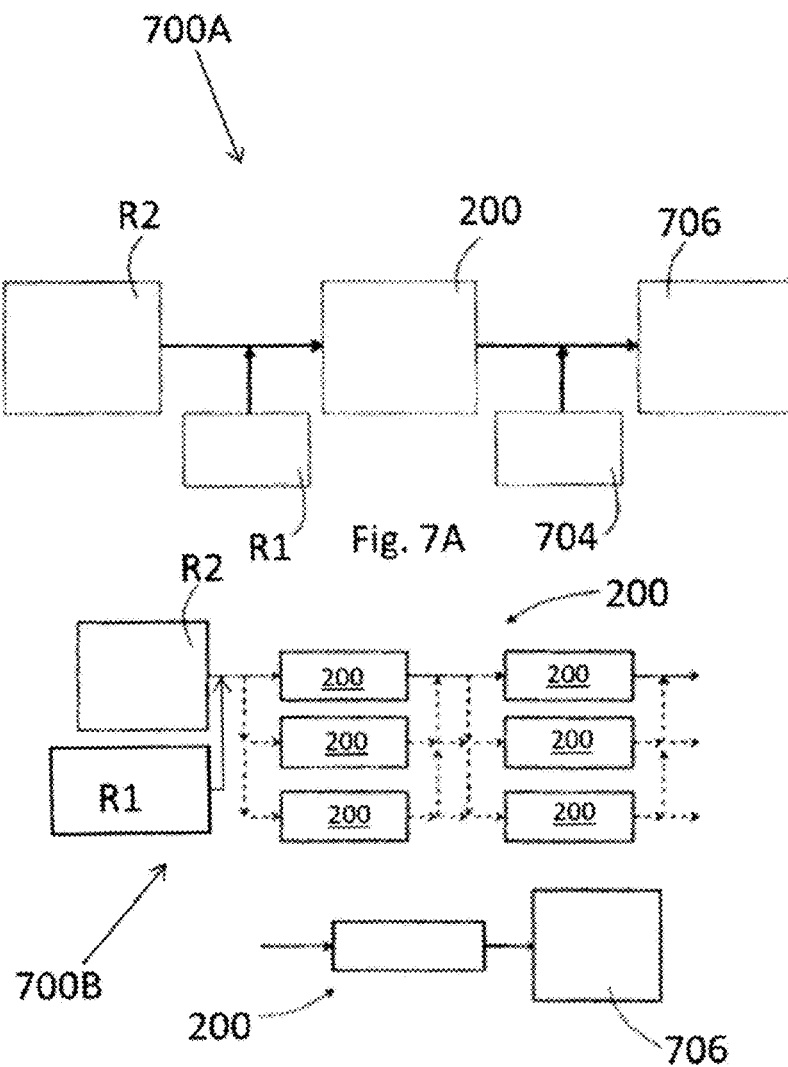

CONCENTRIC FLOW REACTOR

CROSS REFERENCE TO RELATED APPLICATIONS

This application is a continuation of U.S. application Ser. No. 16/250,191, filed Jan. 17, 2019, now U.S. Pat. No. 10,920,340, which is a continuation of 15/410,078, filed Jan. 19, 2017, now U.S. Pat. No. 10,196,755, which is a continuation of U.S. application Ser. No. 14/403,427, filed Nov. 24, 2014, now U.S. Pat. No. 9,574,286, which is a 371 of PCT/SE2013/050594, filed May 24, 2013, which claims the priority benefit of U.S. Provisional Application Ser. No. 61/651,724, filed May 25, 2012.

FIELD

The present invention relates to formation of wires and in particular to gas phase synthesis of wires in the absence of a substrate.

BACKGROUND

Small elongated objects, usually referred to as nanowires, nanorods, nanowhiskers, etc. and typically comprising semiconductor materials, have up till now been synthesized using one of the following routes:
- liquid phase synthesis, for example by means of colloidal chemistry as exemplified US 2005/0054004 by Alivisatos et al,
- epitaxial growth from substrates, with or without catalytic particles as exemplified by the work of Samuelson et al presented in WO 2004/004927 and WO 2007/10781, respectively, or
- gas phase synthesis by means of a laser assisted catalytic growth process as exemplified by WO 2004/038767 A2 by Lieber et al.

The properties of wires obtained using these routes are compared in the following table.

|  | Material quality | Width/length and size control | Structural complexity | Scalability/cost of production |
|---|---|---|---|---|
| Liquid phase | High | Thin/short Medium control | LOW | High/High |
| Substrate-based | High | All/All High control | HIGH | Low/High |
| Laser assisted | Medium | Thin/long Medium control | LOW | Medium/Medium |

Consequently, the choice of synthesis route is a compromise between different wire properties and the cost of production. For example, substrate-based synthesis provides advantageous wire properties. However, since wires are formed in batches, the scalability of the process, and thus the production cost and throughput, are limited.

SUMMARY

An embodiment relates to a gas phase nanowire growth apparatus including a reaction chamber, a first input and a second input. The first input is located concentrically within the second input and the first and second input are configured such that a second fluid delivered from the second input provides a sheath between a first fluid delivered from the first input and a wall of the reaction chamber. As used herein, the term "concentric" has it common meaning of "having a common center". Thus, the concentric aerotaxy™ reactor can be any shape from cylindrical (e.g., having a circular cross section perpendicular to the gas flow direction) to elliptical cylinder shape (e.g., a cylinder having an oval base and cross section perpendicular to the gas flow direction), to any polyhedron shape, such as a box-shape which can also be referred to as a cuboid, a rectangular prism or right-angled parallelepiped.

Another embodiment relates to a method of fabricating nanowires. The method includes providing a first gas stream to a reaction chamber in which the first gas stream includes a first precursor for fabricating the nanowires and providing a second gas stream to the reaction chamber in which the second gas stream forms a sheath separating the first gas stream from a wall of the reaction chamber. The method also includes growing the nanowires in a gas phase in the reaction chamber.

Another embodiment relates to a nanowire growth system that includes the apparatus discussed above and a first fluid reservoir fluidly connected to the first input and at least a second fluid reservoir fluidly connected to the second input. More than two inputs and reservoirs may be used, such as three or more inputs and reservoirs.

BRIEF DESCRIPTION OF THE DRAWINGS

FIG. 2B is a schematic illustration of the aerotaxy™ nanowire growth apparatus of FIG. 2A operated in an embodiment with low core flow.

FIG. 2C is a schematic illustration of the aerotax™ nanowire growth apparatus of FIG. 2A operated in an embodiment with high core flow.

FIG. 2D is a schematic illustration of the aerotaxy™ nanowire growth apparatus of FIG. 2A operated in an embodiment with matched core and sheath flow at the inlet and lower sheath flow compared to core flow at the outlet.

FIG. 2E is a schematic illustration of the aerotaxy™ nanowire growth apparatus of FIG. 2A operated in an embodiment with matched core and sheath flow at the outlet and lower sheath flow compared to core flow at the inlet.

FIG. 4A is a schematic illustration of an aerotaxy™ nanowire growth apparatus according to another embodiment; 4B is a top view of a heat transfer component of the aerotaxy™ nanowire growth apparatus of 4A. Elements of this embodiment may be combined with the embodiment illustrated in FIG. 2A.

FIG. 7A is a schematic illustration of an aerotaxy™ nanowire growth system according to another embodiment;

FIG. 7B is a schematic illustration of a variation of the embodiment of FIG. 7A.

DETAILED DESCRIPTION

Figure 1:
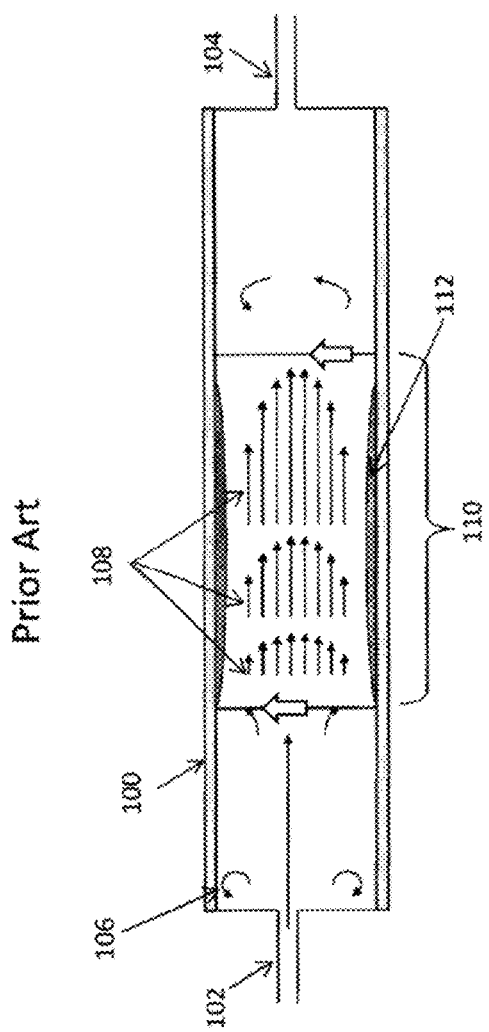
FIG. 1 is a schematic illustration of a prior art aerotaxy™ nanowire growth apparatus.

To grow nanowires with controlled dimensions, it is conventional to nucleate and grow the nanowires on a single crystal substrate. Nanowires are nanoscale structures that have a diameter or width less than 1 micron, such as 2-500 nm or 10-200 nm. The length, however, may be much greater than 1 micron. The present inventors have developed a method of growing nanowires having controlled dimensions in a gas/aerosol phase which does not require the use of a single crystal substrate. Prior methods to grow nanowires in a gas phase are described in PCT Publication Application WO 11/142,717 (the '717 publication), assigned to Qunano AB and hereby incorporated by reference in its entirety. While nanowires can be grown by the methods and apparatus disclosed in the '717 publication, these methods and apparatuses tend to yield nanowires having a wider range of sizes than desirable because nanowire growth by these methods is not stable over time. The inventors have further determined that the conditions of the reactor wall may significantly affect nanowire growth and that these conditions may vary greatly with time which leads to non-uniform nanowire growth over time. Variations in the nanowire sizes grown by the methods and apparatus disclosed in the '717 publication may manifest in a time scale on the order of 15 minutes.

In addition to causing growth variations in the nanowires, the wall of the reactor typically also lowers the utilization of the precursor gases. This is due to the tendency of the precursor gases to react with the reactor wall and to form deposits of nanowire material on the wall. These deposits gradually change the surface chemistry of the reactor, introducing a variability over time in the growth conditions, and consequently in the produced nanowires, reducing the period during which the reactor may be used for continuous production before it needs to be serviced.

Further to the wall effects, a range of nanowire sizes may be generated when using the reactors and methods disclosed in the '717 publication due to the gas flow regime normally used in these methods. Typically, the gases are provided to the reactor under non-ideal flow conditions. "Non-ideal" flow conditions are defined herein to mean any flow condition that is unpredictable, including convective, mixing and turbulent flows, and where a small change in initial or boundary conditions results in a large change in flow trajectories. Further, temperature gradients within the furnace produce convection currents which add to the non-ideality. Individual nanowires within the reactor experience a wide range of process conditions, such as residence time and temperature, resulting in a wide range of nanowire sizes because of the non-ideal flow condition.

Further, even if the precursor gases are provided to the '717 reactor under laminar flow conditions, studies have shown that the growing nanowires still experience a wide range of temperature and/or residence times in the reactor. For example, nanowires flowing through the center of the reactor, spend less time in the reactor than nanowires close to the reactor walls due to the viscous effects of the reactor walls which slows down the gas flow adjacent to the walls. Thus, nanowires flowing through the center of the reactor will be smaller/shorter than nanowires flowing adjacent to the walls of the reactor.

FIG. 1 illustrates an example of the reactor 100 used in the '717 publication methods. The reactor 100 has a single input 102, such as a cylinder, pipe or conduit, and a single output 104, such as a cylinder, pipe or conduit. All reactant gases, dopant gases and catalytic seed particles (if used) are provided to the reactor 100 through the input 102 and are removed from the reactor 100 though the output 104. On entering the reactor 100, some of the gas forms eddies 106 in the corners due to edge effects in the reactor 100. These eddies create or add to non-ideality in the gas flow in the reactor 100. Typically, the reactor 100 has one or more heaters (not shown) that create a reaction zone 110 within the reactor 100. The reaction zone 110 is a region in the reactor 100 which is hot enough to cause decomposition of the precursor(s) and promote nanowire growth in the gas phase.

As discussed above, the wall of the reactor 100 asserts a viscous force on the gases passing through the reactor 100, which results in the gas passing through the reactor 100 adjacent the walls to have a slower velocity than the gas passing through the center of the reactor 100. The relative velocity of the gas in the reactor 100 is illustrated with flow conduits 108. As discussed above, the slow moving precursor gas adjacent to the wall of the reactor 100 may react with the wall of the reactor 100 and form a deposit 112.

In a preferred embodiment of the present invention, concentric flows are used to reduce the variability of the flow, temperature and gas concentration conditions in the core part of the flow. By confining the catalytic nanoparticles to the core region (inside a sheath flow) every particle will have a substantially similar process history, as compared to the '717 publication where, even in the laminar flow case, particles will pass through the reactor 100 with a range of velocities. In the reactor 200, the core and sheath flows can be matched to initially give a "plug" flow condition, where the gas velocity is the same over the entire cross section of the reactor (i.e. a cross section perpendicular to the flow direction). As the flow proceeds through the reactor, surface drag will slow the outermost part of the gas. Depending on the length of the reactor 200, the flow may or may not have time to fully develop into a laminar flow with a parabolic velocity distribution. The ideal plug flow condition can partially be maintained by designing the extractor portion of the reactor (e.g. the outer output portion 204A described below) to pull the sheath gas uniformly. Even in the case of fully laminar flow, the core region will have a narrow velocity distribution, and thus a narrow range of transit times for the catalytic particles.

Furthermore, the sheath flow reduces both the deposition of material on the side wall of the reactor 200 and, even more importantly, eliminates the back-diffusion of material from the wall to the core flow, ensuring that there is minimal cross-talk between the reaction volume and the reactor wall. Thereby, process stability is also improved in time, leading to better product and longer maintenance intervals.

Figure 2A:
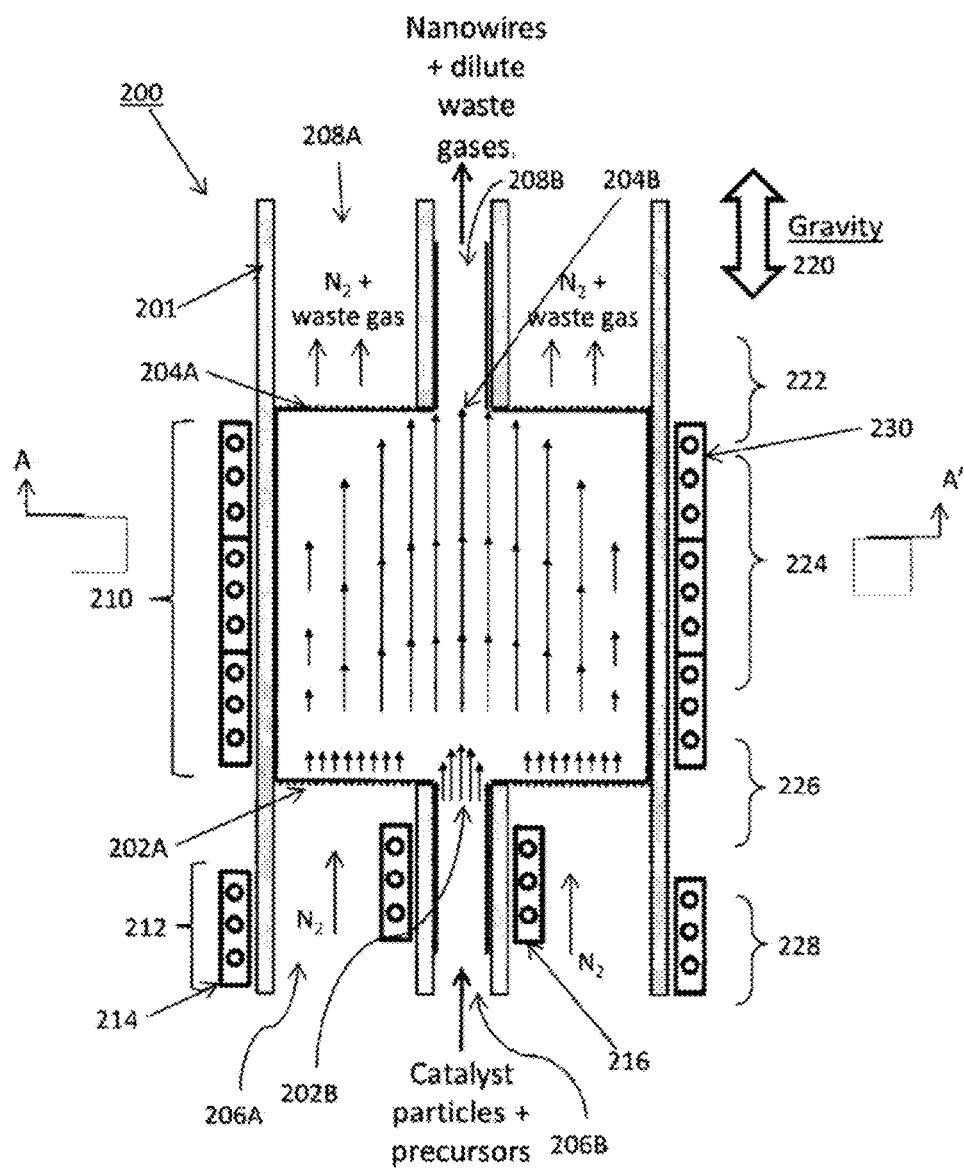
FIG. 2A is a schematic illustration of an aerotaxy™ nanowire growth apparatus according to an embodiment.

FIG. 2A illustrates an aerotaxy™ nanowire growth reactor 200 according to an embodiment of the invention. Aerotaxy™ is a trademark of Qunano AB and refers to a gas phase nanowire growth process. The reactor 200 includes a housing 201 (e.g. a CVD reaction tube), which is preferably oriented vertically, but which may be oriented horizontally. The reactor 200 also includes an outer input 202A, an inner input 202B, an outer output 204A and inner output 204B to and from the reaction zone 210, respectively. Preferably, the inner input 202B is located concentrically within the outer input 202A, although the inner input 202B may be off center, such as by 1-25%, such as by 1-10%. The outer input 202A and the inner input 202B may be inlet openings to the reaction zone 210 of the reactor 200, and can be connected to any suitable gas or aerosol delivery conduit, such as a cylinder, hose, pipe or manifold. For example, outer input 202A and inner input 202B may be connected to inert gas inlet conduit 206A and precursor inlet conduit 206B, respectively, and inner output 208B and outer output 208A may be connected to an inner output conduit 208B and an outer output conduit 208A, respectively. Preferably, the inner and outer inputs 202A, 202B are configured such that a second fluid delivered from the outer input 202A provides a sheath between a first fluid delivered from the inner input 202B and a wall 201 of the reaction chamber 200. This may be accomplished, for example, by preferably providing both the first and second fluids under laminar conditions and/or having the outer input 202A sufficiently wider (e.g. 50-500% wider) than the inner input 202B, such that even if there is mixing of the first and second gas streams (shown by the arrows in FIG. 2) at the interface between the gas streams as they flow through the reactor 200, the thickness of the sheath (second) gas stream is such that the first gas stream does not substantially (e.g., 0-5 vol % come into contact with the wall) contact the wall of the reactor 200 while in the reaction zone 210. Under laminar or plug flow, the core flow lines will not hit the reactor walls. In this case, the sheath prevents gas from diffusing between the wall and the core flow.

Other factors that may be considered when configuring inner and outer inputs 202A, 202B and the reactor 200 may be described as boundary conditions. A first boundary condition 220 concerns the orientation of the reactor 200 in relation to gravity. Preferably, the reactor 200 is oriented such that the direction of flow in the reactor 200 is substantially parallel to the force of gravity (e.g. within 0-10% parallel to the force of gravity). In this manner, gravity will not act to cause a mixing flow transverse to the flow of gases through the reactor 200. The gas flow may be configured in the direction of gravity, e.g. gas inputs located at the top of the reaction zone 210 such that the gas streams flow "down" through the reaction zone 210 to outputs located at the bottom of the reaction zone 210. Alternatively, the gas flow may be against gravity, e.g. gas inputs located at the bottom of the reaction zone 210 such that the gas streams flow "up" through the reaction zone 210 to outputs located at the top of the reaction zone 210.

A second boundary condition 222 is drawn to uniform extraction of the sheath gas from the reactor 200. Non-ideality at the output end of the reactor 200 can be minimized or eliminated by configuring the outer output 204A such that the sheath gas is uniformly extracted from the reactor 200 reaction zone 210. A corresponding fourth boundary condition 226 is drawn to uniform injection of the sheath gas to the reactor 200 reaction zone 210. Non-ideality at the input end of the reaction zone 210 and through the reaction zone 210 can be minimized or eliminated with uniform injection of gases in the outer input 202A. The resulting uniform flow though the reactor 200 may be described as 'plug' flow.

A third boundary condition 224 is uniform gas and wall temperature in the reaction zone 210. By making the wall temperature and the gas temperature uniform, such as a variance of less than 5%, e.g. 0-5%, in the reaction zone 210, the formation of convection currents can be reduced or eliminated. This in turn, reduces the likelihood of generating non-ideal flow conditions in the reactor 200. A fifth boundary condition 228 is drawn to maintaining a controlled temperature gradient in a first heating zone 212 in the outer inlet conduit 206A which is connected to inlet 204A. The temperature of the sheath gas may be raised to the desired reaction temperature in the first heating zone 212 with heater(s) 214 located adjacent to conduit 206A. As will be discussed in more detail below, the first precursor gas and the optional catalytic particles may be heated to the desired reaction temperature with second heaters 216. Alternatively, the precursor gases may be actively cooled until the point of entry into the reaction zone 210, in which case device 216 is a cooling device. Thus, device 216 may be referred to as a temperature control device (i.e., a heater and/or cooler). Further, the reaction zone 210 may be heated with one or more heaters 230. In an embodiment, several heaters 230 are located along the reaction zone 210. These heaters 230 may be configured to be controlled independently and thereby more than one reaction zone 210 may be established within the reactor 200.

Inert gas may be provided to the outer input 202A via the outer input conduit 206A. One or more semiconductor nanowire precursor gases may be provided to the inner input 202B via the inner input conduit 206B. The rector 200 does not include a growth or deposition substrate in the reaction zone; instead the nanowires are collected from the inner output conduit 208B via the inner output 204B and then deposited on a substrate. Additionally, the nanowires grown the by the methods of the present application do not need laser assistance for growth.

Sheath gas exiting the reactor 200 reaction zone 210 can be collected through the outer output 204A while the nanowires and unreacted precursor gas can be collected through the inner output 204B. If an inert gas is used as the sheath gas, some unreacted precursor gas may mix with the inert gas in the reactor 200 and exit via the outer output 204A. This unreacted precursor gas may be separated from the inert sheath gas and recycled for later use in the reactor 200.

As discussed above, optional catalytic particles may be provided to one or more of the gas flows in this embodiment or the embodiments that follow. Catalyst materials include, but are not limited to, Au, Ag, Cu, Fe, Ni, Ga, In, Al and alloys thereof. The catalytic particles may consist of a single element, or a combination (e.g. alloy) of two or more elements. Further, the catalyst particles may be provided without electrical charge or the catalytic particles may be given a charge. The catalytic particles may be provided in the form of an aerosol generated by an upstream aerosol generator. Alternatively, the catalyst particles may be formed in-situ by providing a gaseous precursor (e.g. trimethyl gallium (TMG)) that reacts or decomposes to form catalyst (e.g. Ga) particles. Inert gas forms an outer sheath or cylinder along the reactor wall 201, a catalyst particle aerosol forms or is provided to a middle sheath or cylinder inside the outer sheath, and nanowire precursor(s) form an inner gas stream inside the middle sheath which interacts with the catalyst particles in the middle sheath to grow nanowires therein. Additionally, one or more of the precursor gases may also be provided to the outer input conduit 206A, thus being allowed to diffuse into the flow of catalytic particles.

As used herein, the term "concentric" has it common meaning of "having a common center". Thus, the concentric aerotaxy™ reactor can be any shape from cylindrical (e.g., having a circular cross section perpendicular to the gas flow direction) to elliptical cylinder shape (e.g., a cylinder having an oval base and cross section perpendicular to the gas flow direction), to any polyhedron shape, such as a box-shape which can also be referred to as a cuboid, a rectangular prism or right-angled parallelepiped. Polyhedron shapes other than box-shapes having any polygonal cross sectional shape parallel or perpendicular to the gas flow direction (e.g., a pentagon, hexagon, etc. shaped cross section perpendicular to the gas flow direction) can also be used without appreciable alteration of the functionality described herein. The extremes of these configurations are cylindrical reactor with an essentially pillar-shaped core flow with one or more cylindrical sheath flows, as shown in FIG. 2G and the flat box-shaped configuration where the thickness of the cuboid shaped reactor is at least two times smaller, such as at least two times, such as 2-1000 times, or such as 5-50, or 10-100 times smaller than the length of the cuboid in the plane perpendicular to the gas flow direction, as shown in FIG. 2H. In FIG. 2H, the sheet-formed core flow from input 202B has a thickness than is at least 2 times, such as 5-50, or 10-100 times smaller than its length. The core-flow is sandwiched between two portions of the sheath-flow from inputs 202A located on both sides of the input 202B in the thickness direction. If the aerosol is not injected close to the edge of the reactor, then edge effects would be minimal and the thickness may be 5-10 times smaller than the length. Alternatively, if there is aerosol injected close to the edge, then the thickness may be 50-1000 times, such as 100-500 times, smaller than the length so that chamber edge effects on the flows are negligible.

The cylindrical reactor of FIG. 2G facilitates superior flow-symmetry, while the box-shaped reactor of FIG. 2H can be scaled up to large dimensions while retaining transverse flow dimensions and their ratios (pulp/pip ratios), as to still apply for rates of diffusion and intermixing of source materials and catalytic particles between the flow regions. The division into core and sheath flow are illustrated by the examples in FIGS. 2A-2F and 3A-5 which are to be regarded as having cross section of either a cylinder shown in FIG. 2G or an extended flat cuboid geometry with arbitrary extension in/out of the image plane shown in FIG. 2H or any shape in between.

In the case where the reactor has an extended flat geometry (e.g., the cuboid shape of FIGS. 2H and 2I), an additional degree of freedom is introduced regarding the flows and especially the injection of growth precursors. For example, as shown in FIG. 2I, the group III-containing molecules (e.g. trimethyl gallium, TMG) can be injected from inlet 202B on one side of the aerosol seed catalyst particle flow from the central inlet 202C, and the group V-containing precursor molecules (e.g., AsH$_3$) can be injected from inlet 202D on the other side of the aerosol seed catalyst particle flow from central inlet 202C in the thickness direction, as shown in FIG. 2I. The sheath flows are injected in the outer portions of the apparatus from inlets 202A in the thickness direction. By allowing the growth species to meet only in the region where there are catalytic seed particles, homogeneous parasitic gas phase reactions can be reduced even further, as these reactions require both growth species to be present. The same holds for parasitic wall reactions.

Figure 3A:
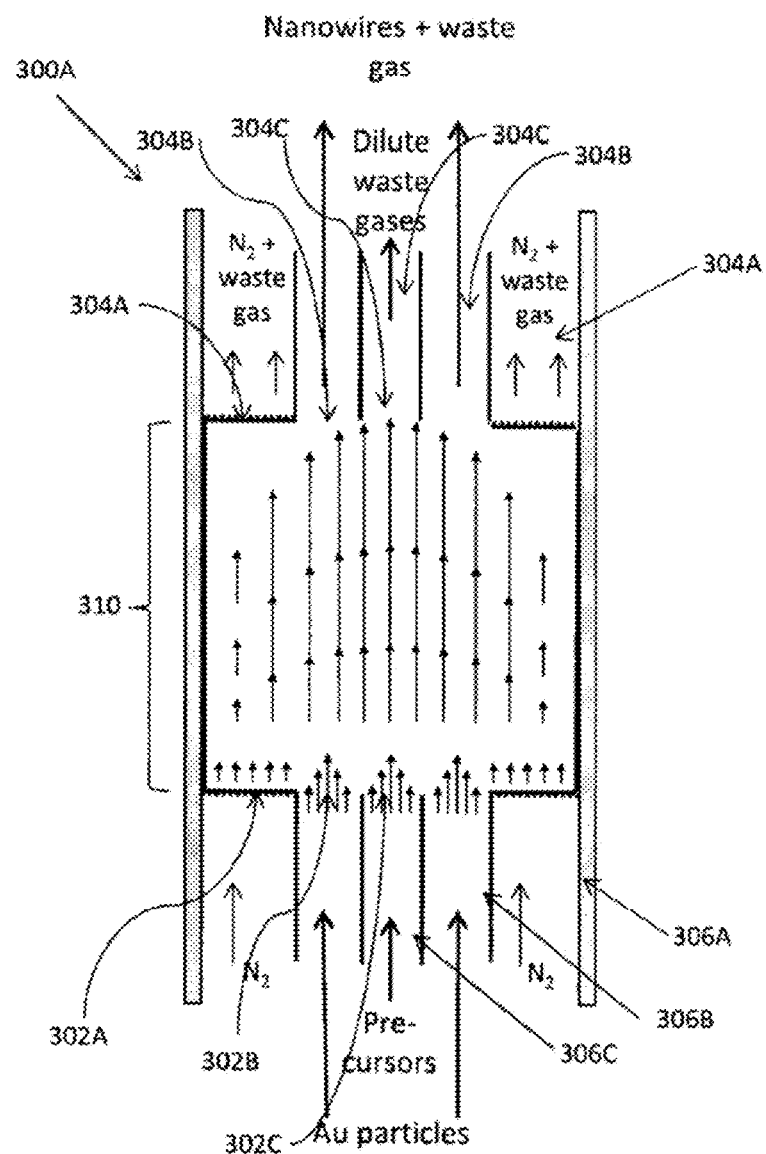
FIG. 3A is a schematic illustration of an aerotax™ nanowire growth apparatus according to another embodiment.

FIG. 3A illustrates an aerotaxy™ nanowire growth reactor 300A according to another embodiment of the invention. The reactor 300A of this embodiment includes three inputs 302A, 302B, 302C and three outputs 304A, 304B, 304C. The three inputs 302A, 302B, 302C and three outputs 304A, 304B, 304C may be respective inlet and outlet openings to any suitable delivery or extraction conduit, such as a cylinder, hose, pipe or manifold. For example, each of the three outer, middle and inner inputs 302A, 302B and 302C is connected to a respective one of the outer, middle and inner conduits 306A, 306B and 306C. The sheath gas is provided to the outer most input 302A.

In another embodiment, the tri-axial configuration of FIG. 3A can be used to control the timing of the precursor arrival at the catalyst particles. For example, the catalyst particles can be pre-mixed with the group III precursor (e.g., TMG) and sent through input 302C, while the group V precursor (e.g., AsH$_3$) is mixed with the sheath gas and sent into the chamber through input 302A, while the input 302B is provided with clean (i.e., pure or unmixed) sheath gas. This way, the catalyst particles are pre-alloyed with the group III metal (e.g., Ga is pre-alloyed with Au or Ag catalyst particles) from the group III precursor before encountering the group IV precursor (e.g., AsH$_3$) which enters the catalyst/group III core flow through diffusion. The difference in timing is controlled by the magnitude of the clean sheath flow into input 302B. For nanowire doping, it may be advantageous to pre-alloy the catalyst by injecting the dopant precursors into input 302C or 302B. This concept is easily extended to other combinations of flows and precursors. In the box-shaped or planar configuration shown in FIGS. 2H and 2I, the mixing of reactants can be further controlled by injecting different gases on either side of the core flow, and by using different flows; the timing can be independently controlled by using different settings of the clean middle sheath flow on either side of the core flow.

In one aspect of this embodiment, catalytic particles, such as gold or silver particles, may be provided to the middle input 302B. As discussed above the catalytic particles may include individual metals or alloys. In a preferred aspect, the catalytic particles are provided in the form of an aerosol generated by an upstream aerosol generator.

One or more nanowire precursor gases may be provided to the inner input 302C. As will be discussed in more detail below, one or more doping gases may also be provided to the inner input 302C to dope the growing nanowire. In an alternative aspect, the precursor and doping gases may be provided to the middle input 302B while the catalytic nanoparticles are provided to the inner input 302C. In another aspect, one or more precursor may be provided either of the middle input 302B or the inner input 302C while a second, different precursor is provided to the other of the middle input 302B or the inner input 302C. In this aspect, catalytic particles may be provided to either or both of the middle input 302B and the inner input 302C. One or more of the precursor gases may also be provided to the outer input 302A, thus being allowed to diffuse into the flow of catalytic particles.

As in the previous embodiment, the inputs 302A, 302B, 302C are configured such that the gas delivered from the outer input 302A provides a sheath between the precursor gases/catalytic particle aerosol the wall of the reaction chamber. In this manner, the growing nanowires in the central gas steam from inputs(s) 302A, 302B will experience essentially the same process conditions for essentially the same amount of time and thereby nanowires can be grown having a narrow range of controlled dimensions. Sheath gas exiting the reaction zone 310 is collected with the outer output 304A. The unused precursor gas(es) and the nanowires are collected in with the middle and inner outputs 304B, 304C. For example, nanowire and waste gas may be collected in the middle output 304B, waste gas in the inner output 304C and waste gas in the outer output 304A. As in the previous embodiment, unused precursor gas entrained in the sheath gas may be separated from the sheath gas and reused.

The embodiment of FIG. 3A illustrates several advantages of the concentric aerotaxy™ nanowire growth reactor. Since the catalyst particles have relatively high mass and low vapor pressure their mixing due to inter-diffusion is fairly slow and will thus remain in the core gas flow. The group III precursor, such as TMG (and its thermally decomposed Ga-comprising reactants) and group V precursor, such as AsH$_3$, on the other hand, have a relatively high gas phase diffusion rate and will tend to establish a constant concentration in the plane vertical to the flow. By adjusting pressure and flow rates or adjusting inner injectors, as described below, a core reaction-flow comprising homogeneously mixed TMG and catalyst particles can be readily established before AsH$_3$ is introduced. By the introduction of AsH$_3$ nucleation and epitaxial growth can be initiated instantaneously, facilitating the fabrication of homogeneously dimensioned layers and nanowires.

Source material utilization in traditional (non-vacuum) epitaxy, using flat substrates, is mainly limited by parasitic wall reactions, parasitic gas phase reactions and substantial over-use of material to establish flow and concentration profiles that lead to homogeneous layer growth rates over large substrate areas. The concentrations at the growth front are limited by gas phase diffusion through the so-called stagnation layer, formed between the incoming gas flow and the epitaxial growth front at the substrate surface; therefore, a source-rich inlet flow is needed in order to reach source concentrations sufficient for intended epitaxial growth rates at the epitaxial surface, or growth front. The concentrations in the incoming flows need to be appreciably higher than the concentration at the growth front in order to be sufficiently constant over the extent of the substrate area. Concentric aerotaxy™ differs fundamentally from substrate growth in that the growth front is distributed in the gas (in the form of catalytic particles) and thus growth is not diffusion limited. This essentially eliminates the stagnation layer related to the flat substrate, and allows higher source concentrations than those used in planar epitaxy, without leading to gas phase reactions. Source gas concentrations can be set to the levels needed at the growth front, which reduces the fraction of unused source material in the gas. Furthermore, in the concentric aerotaxy™ reactor the epitaxial growth fronts are brought along with the reactants, in contrast to traditional growth, where reactants are made to pass over the substrate, further extending the ability to improve source utilization. With the reactive flow localized to the core of the reactor and the use of higher gas concentrations, much higher growth rates are achieved. The depletion of source gases over time will mainly be due to crystal growth, not parasitic reactions, and will be a function of residence time, initial concentrations, epitaxial reaction rates and position in the reactor. All this yields an unprecedented high growth rate, combined with a high source utilization of between 20% to 30% of at least one of the growth sources (i.e., precursors), and preferably above 40% or 50%. In some embodiments, a source utilization of at least one the sources is higher than 60% or 70%, such as 60-75%. Thus, the utilization of at least one and preferably all growth precursors, such as TMG and AsH$_3$ for GaAs nanowire growth is between 20% and 75%, preferably 40-75%.

Figure 3B:
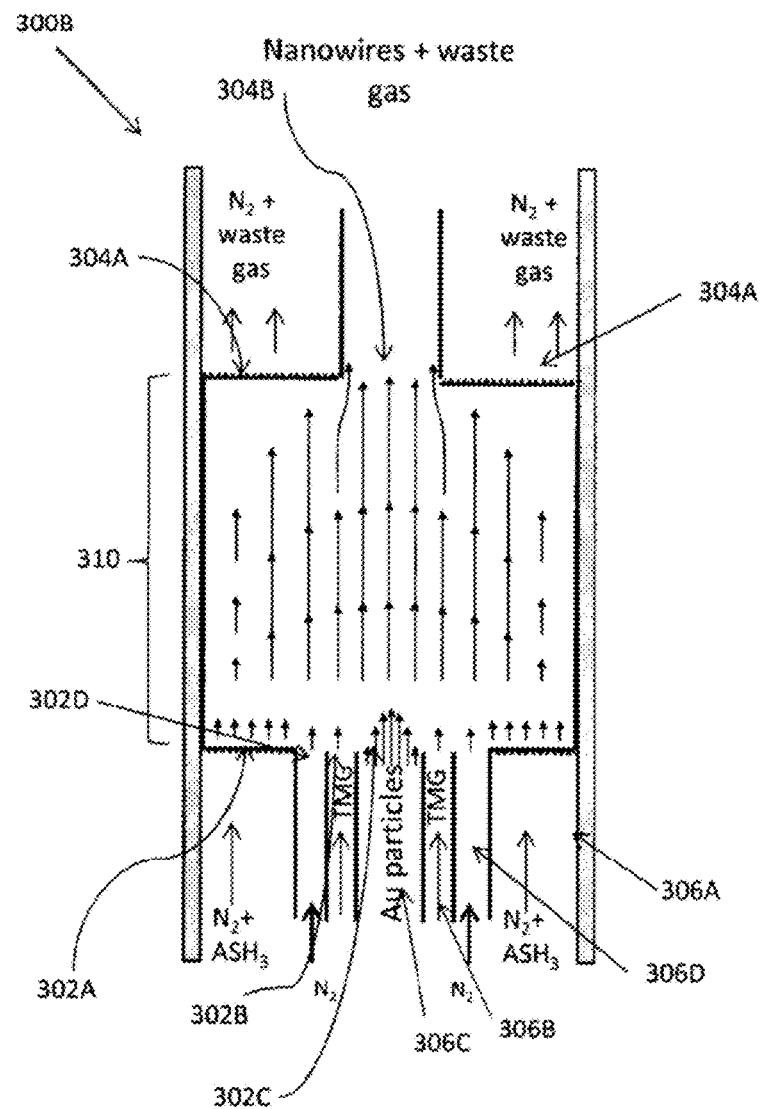
FIG. 3B is a schematic illustration of an aerotaxy™ nanowire growth apparatus according to another embodiment.

FIG. 3B illustrates an aerotaxy™ nanowire growth reactor 300B according to another embodiment of the invention. In this embodiment, the precursors are provided via separate inlets and are preferably separated from each other by a sheath gas flow stream. The reactor 300B of this embodiment includes four inputs 302A, 302B, 302C, 302D and two outputs 304A, 304B. Thus, the reactor 300B has an additional input 302D compared to reactor 300A of FIG. 3A and one less output compared to reactor 300A. The inputs and outputs may be respective inlet and outlet openings to any suitable delivery or extraction conduit, such as a cylinder, hose, pipe or manifold. For example, each of the four outer, inner middle, outer middle and inner inputs 302A, 302B, 302D and 302C is connected to a respective one of the outer, inner middle, outer middle and inner conduits 306A, 306B, 306D and 306C.

The sheath gas is provided to the outer most input 302A and to the adjacent outer middle input 302D. The catalytic particles, such as gold or silver particles, may be provided to the inner input 302C. As discussed above the catalytic particles may include individual metals or alloys. In a preferred aspect, the catalytic particles are provided in the form of an aerosol generated by an upstream aerosol generator.

One or more nanowire precursor gases may be provided to the inner middle input 302B and the other one or more nanowire precursor gases may be provided to the outer input 302A together with the sheath gas. For example, to grow III-V semiconductor nanowires, such as GaAs nanowires, the group III precursor gas, such as TMG is provided to the inner middle input 302B while the group V precursor gas, such as AsH$_3$ may be provided to the outer input 302A such that it is mixed with the sheath gas. Thus, the group III precursor gas flows around the inner catalytic particle flow, while the sheath gas (e.g., nitrogen) from the middle outer input 302D provides a sheath between the group III precursor gas flow and the group V precursor gas flow (which is mixed with the sheath gas) in the apparatus. Thus, in this embodiment, a core reaction-flow comprising homogeneously mixed TMG and catalyst particles can be readily established before AsH$_3$ is mixed with this flow due to the intervening sheath gas flow from input 302D between them. When the AsH$_3$ flow penetrates through the intermediate sheath flow from input 302D into the core reaction-flow downstream of the inputs, nucleation and epitaxial growth can be initiated instantaneously, facilitating the fabrication of homogeneously dimensioned layers and nanowires. It is well known in the art of substrate-based nanowire growth that nanowires preferentially grow with good quality from pre-alloyed seed particles. The separation in time and space of the growth precursors leads to pre-alloying of, for example, catalyst metal particles and group III metals from the group III precursor (e.g., pre-alloying of Au and Ga) and gives substantially defect-free nanowire growth. In one embodiment, as described elsewhere herein, pre-alloying can be performed by placing the inputs of the catalyst particles and the at least one source element (e.g., the group III precursor such as TMG) closer to each other and/or upstream compared to the input of a second precursor (e.g., the group V precursor), to enable flight of time for pre alloying.

As will be discussed in more detail below, one or more doping gases may also be provided to the input(s) 302A and/or 302B to dope the growing nanowire. The unused precursor gas(es) and the nanowires are collected in with the outer and inner outputs 304A, 304B. For example, nanowire and waste gas may be collected in the inner output 304B, and waste gas and sheath gas in the outer output 304A. As in the previous embodiment, unused precursor gas entrained in the sheath gas may be separated from the sheath gas and reused.

FIGS. 2B, 2C, 2D and 2E illustrate additional embodiments of methods of operating the aerotaxy™ nanowire growth apparatus 200 of FIG. 2A. Specifically, FIG. 2B illustrates the fluid behavior in the apparatus 200 when operating with a low core flow (i.e. the core flow rate is less than the sheath flow rate) while FIG. 2C illustrates the fluid behavior in the apparatus 200 when operating with a high core flow (i.e. the core flow rate is greater than the sheath flow rate). The residence time of the nanowires in the apparatus 200 may be influenced by controlling the ratios of flows (i.e. flow rates) in the core (inlet 202B) and sheath (inlet 202A) regions. If the sheath gas flow (inlet 202A) is increased such that the mean gas velocity in the sheath is higher than the core flow (inlet 202B), then the gas in the core flow will accelerate resulting in a contraction 1402 of the diameter of the core flow stream, as depicted in FIG. 2B.

If the inverse flow situation is applied, whereby the mean velocity of the core gas is higher than that of the sheath gas, then the core gas flow (and any catalytic particles contained within) will expand resulting in an expansion 1404 of the diameter of core gas stream, as depicted in FIG. 2C. The situation in FIG. 2B results in a decrease in nanowire residence time in the reactor 200, while situation illustrated in FIG. 2C results in an increase in nanowire residence time in the reactor 200. This process may be important when reactors are placed in series as the flow into the second stage reactor will be directly dependent on the flow used in the first stage. This method allows the residence time in sequential reactors to be independently controlled.

FIGS. 2D and 2E depict how the width of the core reaction flow can be expanded and decreased by applying asymmetrical input and output ratios between sheath and core flow. FIG. 2D illustrates the fluid behavior in the apparatus 200 when operating with matched (i.e., the same or similar) core and sheath flow at the inlet, and lower sheath flow compared to core flow at the outlet. When the mean velocity of the core gas is higher than that of the sheath gas at the outlet, then the core gas flow (and any catalytic particles contained within) will expand resulting in an expansion 1404 of the diameter of core gas stream at the outlet 204B.

FIG. 2E illustrates the fluid behavior in the apparatus 200 when operating in inverse mode to that shown in FIG. 2D. In FIG. 2E, the apparatus is with matched core and sheath flow at the outlet and lower sheath flow compared to core flow at the inlet. When the mean velocity of the core gas is higher than that of the sheath gas at the inlet, then the core gas flow (and any catalytic particles contained within) will expand resulting in an expansion 1404 of the diameter of core gas stream at the inlet 202B.

Figure 2F:
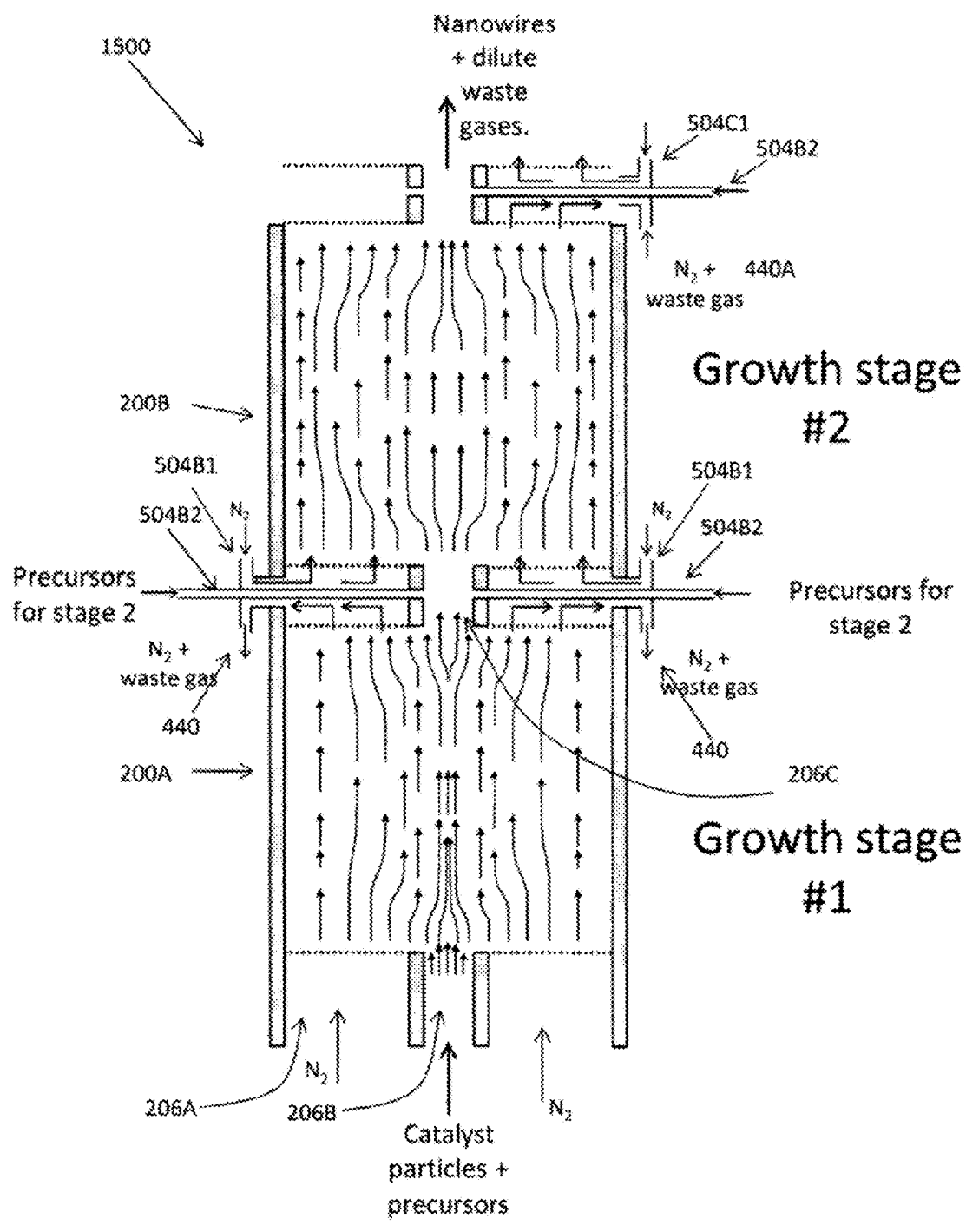
FIG. 2F is a schematic illustration of an aerotaxy™ nanowire system with stacked aerotax™ nanowire growth apparatuses.
Figure 2G:
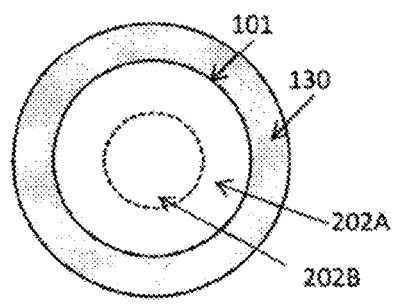
FIGS. 2H and 2G are top cross sectional views along line A-A' in FIG. 2A.
Figure 2H:
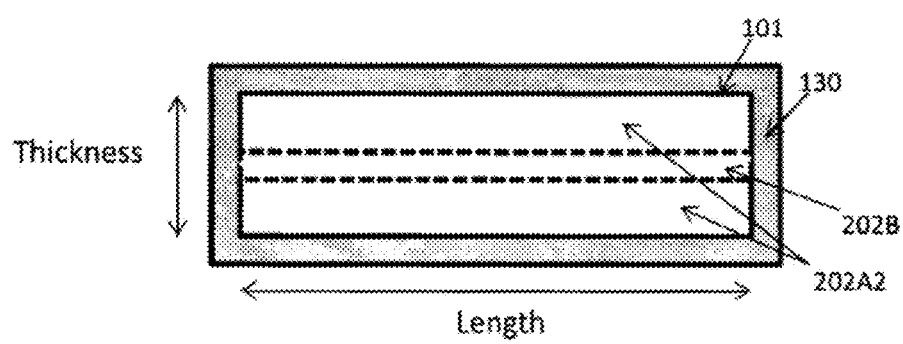
Figure 2I:
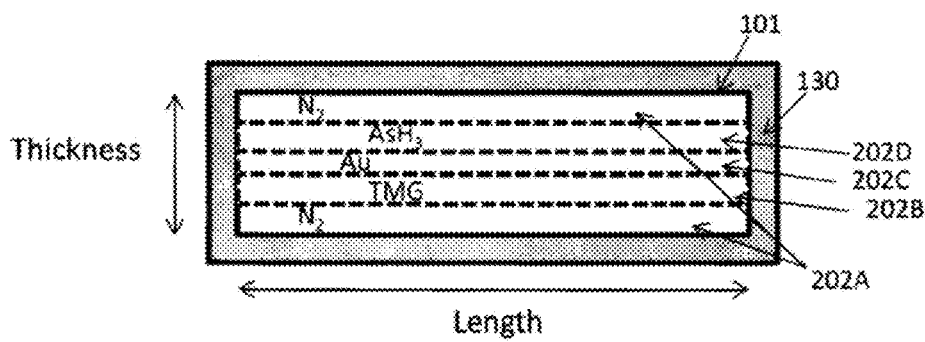
FIG. 2I is a top cross sectional view the aerotaxy™ nanowire growth apparatus according to another embodiment.

FIG. 2F illustrates an aerotaxy™ nanowire system 1500 with series connected aerotaxy™ nanowire growth apparatuses 200A, 200B according to another embodiment. As illustrated, the nanowire system 1500 include two growth stages, i.e., the system includes two nanowire growth apparatuses 200A, 200B described in the previous embodiment in which the core outlet of the first state is connected to the core inlet of the second stage.

However, the system 1500 may have any number of nanowire growth apparatuses/stages, such as three or more stages. Further, the system 1500 may include any of the embodiment of the nanowire growth apparatuses 200, 200A, 200B, 300A, 300B, 400, discussed herein. Additionally, the system may include nanowire growth apparatuses 200, 200A, 200B, 300A, 300B, 400 in any combination, and/or including a stack in which all of the apparatus are of the same embodiment. Thus, for example, the system 1500 may be configured with any combination of reactor(s) 200A having a higher core flow than sheath flow and/or reactor(s) 200B having a lower core flow than sheath from. Further, by stacking reactors with different relative flow rates, the system may take advantage of the Venturi effect to further vary the size of the core flow.

Preferably, the system 1500 includes a gap between adjacent nanowire growth apparatuses 200, 200A, 200B, 300A, 300B, 400 in the stack through which feed conduits (e.g. 504B1, 504B2) and gas outlets (e.g. 440) may be provided. For example, a feed conduit 504B1 may be configured to provide sheath gas to the outer input conduit 206A of the second reactor 200B, while a feed conduit 504B2 may be configured (e.g., it extends to and/or points at the core flow area between the reactors 200A, 200B) to provide precursor(s) and/or catalyst particles to the inner input conduit 206B of the second reactor 200B. At each stage, the sheath gas and entrained precursor gas (i.e. waste gas) in the sheath gas may be removed with gas outlets 440, 440A. In this manner, new precursors and sheath gas may be supplied to each new stage and old sheath gas and waste gas removed. Additionally, the stages can be stacked vertically, horizontally or any combination in between. In an embodiment, the entire stack is enclosed in an outer housing (not shown).

Figure 4A:
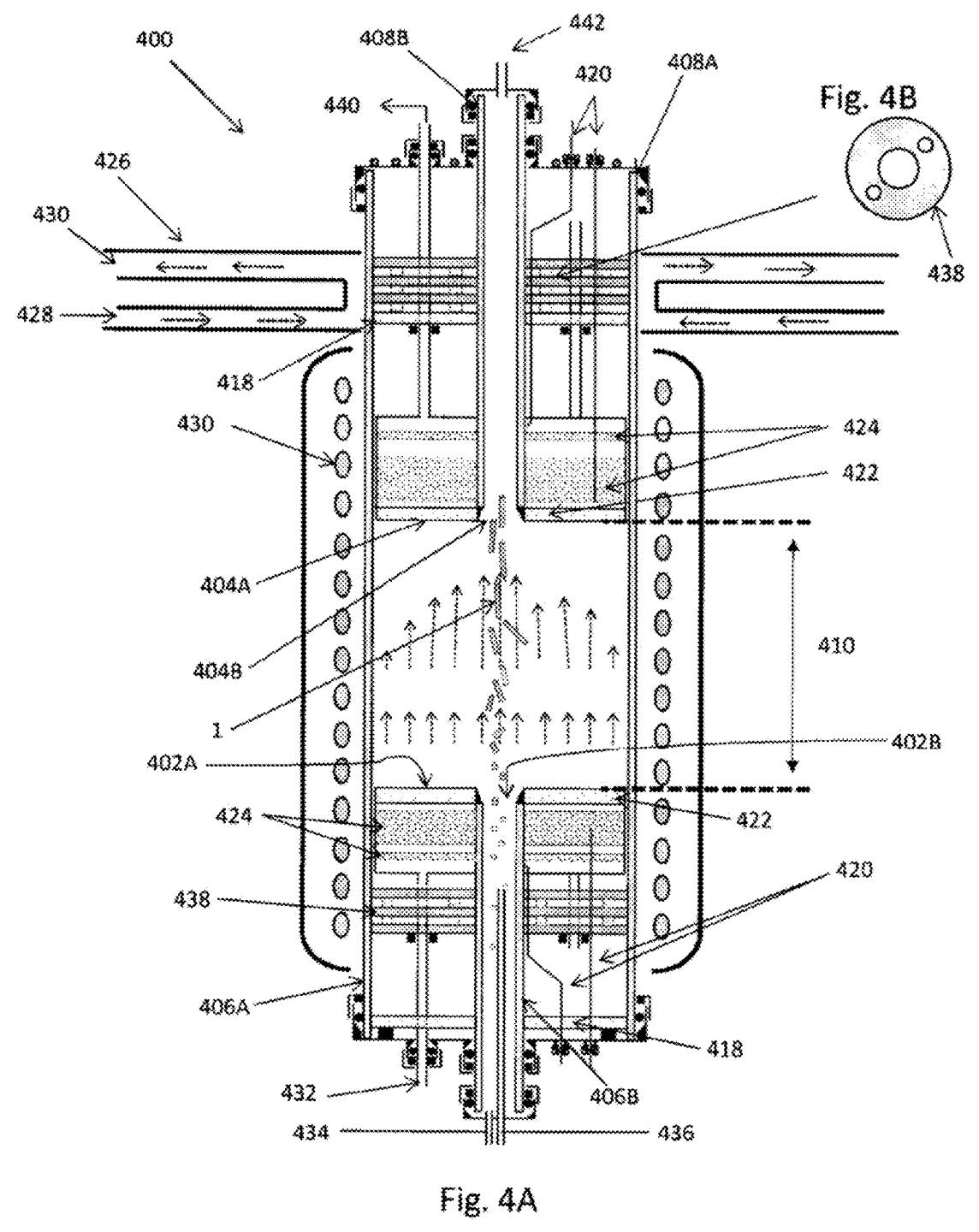
Figure 5:
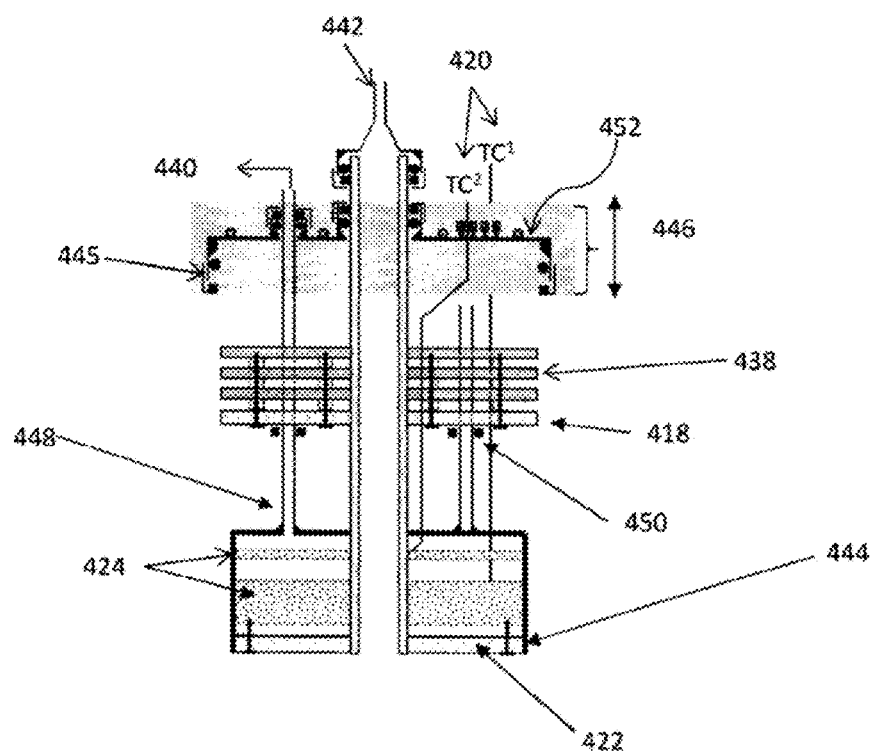
FIG. 5 is a schematic illustration of the extractor portion of the aerotaxy™ nanowire growth apparatus of FIG. 4A.

FIGS. 4A, 4B and 5 illustrate another embodiment of an aerotaxy™ nanowire growth reactor 400 which is similar to the reactor 200, but which contains additional elements. The reactor 400 includes an outer input 402A, an inner input 402B, an outer output 404A and inner output 404B. The sheath gas is provided to the outer input 402A from a reservoir, discussed in more details below, via a sheath gas inlet 432 located in an outer input conduit 406A. The catalyst may be aerosolized and provided to the inner input 402B via a catalyst inlet 434 located in an inner input conduit 406B. One or more precursor gases may be provided to the inner input 402B via a precursor inlet 436 to the inner input conduit 406B. Inlets 432, 434, 436 may comprise any conduits, such as a cylinder, hose, pipe or manifold. Sheath gas inlet 432 is located in the outer input conduit 406A. The catalyst aerosol inlet 434 and the precursor inlet 436 are located in the inner input conduit 406B, with the precursor inlet 436 extending farther up the inner input conduit 406B than the catalyst inlet 434. The temperature of the sheath gas, catalyst aerosol and precursor gases may be monitored at the outer and inner inputs 402A, 402B and in the outer and inner input conduits 406A, 406B with one or more thermocouples 420.

Heat may be supplied to the outer input conduit 406A, the reaction zone 410 and the outer output conduit 408A with one or more heaters 430. To heat the inner input conduit 406B, heat may be transferred from the outer input conduit 406A to the inner input conduit 406B via transfer elements 438 located in a lower portion of the reactor 400. To extract heat from the inner output conduit 408B, heat may be transferred from the inner output conduit 408B to the outer output conduit 408A via transfer elements 438 located in an upper portion of the reactor 400. The heat transfer elements 438 may be, for example, disks made of material with a high thermal conductivity, such as aluminum or copper as shown in FIG. 4B. The distal end (furthest from the reaction zone 410) of the outer input conduit 406A may be provided with a heat shield/insulation 418 (e.g. a material with a low thermal conductivity). The heat shield/insulation 418 reduces heat loss out of the outer input conduit 406A and thereby aids in maintaining a stable temperature gradient in the outer input conduit 406A.

The outer input conduit 406A may be provided with one or more frits or filters to provide an equilibrated pressure ensuring a circularly symmetrical plug flow. In an embodiment, the outer input conduit 406A is provided with one or more low porosity, e.g., frits or filters 424 and/or one or more high porosity, e.g., frits or filters 422. The low porosity frits or filters 424 may be made of any suitable material such as sintered stainless steel. The high porosity frits or filters 422 may be made of any suitable material, such as metal or ceramic wool or woven fiber such as $SiO_2$, $Al_2O_3$, or steel wool.

The outer output conduit 408A may be provided with a cooling collar 426. The cooling collar 426 has a fluid input 428 and a fluid output 430. The fluid may be either a liquid or gas. The cooling collar 426 extracts heat from the outer output conduit 408A and thereby cools the sheath gas. Additionally, if heat transfer elements 438 are provided in the outer output conduit 408A as discussed above, heat may be extracted from the inner output conduit 408B and thereby cool the unreacted precursor gas(es) and the nanowires. The temperature of the outer output conduit 408A and the inner output conduit 408B may be monitored with one or more thermocouples 420.

The sheath gas may be removed from the outer output 404A via conduit 408A and a gas outlet 440 and sent to a reservoir as discussed in more detail below. The unreacted precursor gas and the nanowires may be removed from the reactor 400 via an outlet 442 from the inner outlet conduit 408B.

FIG. 5 illustrates and provides more detail of the exit portion of the aerotaxy™ nanowire growth reactor 400. Preferably, the exit portion is essentially identical to the inlet portion to maintain symmetric gas flow. The high porosity frits/filters 422 and the low porosity frits/filters 424 may be assembled in a housing 444. The housing 444 may be made of any suitable material, such as stainless steel or molybdenum. Sheath gas flowing from the reaction zone 410 through the high porosity frits/filters 422 and the low porosity frits/filters 424 is channeled into a conduit or pipe 448 which passes through the heat shield 418 and one or more heat transfer elements 438 located in outer output conduit 408A on the way to the sheath gas outlet 440. In an embodiment, the heat shield 418 and one or more heat transfer elements 438 may be held in place above the housing 444 with clamps 450 secured to the conduit or pipe 448. Other suitable fastening devices may be used to hold the heat shield 418 and the heat transfer element(s) 438 in place, such as screws, bolts and the like.

The size of the reaction zone 410 can be adjusted by raising or lowering the outer and inner inputs 402A, 402B, the inner and outer outputs 404A, 404B (indicated by range 446) or both. This adjustment can be made by operation of an adjustment mechanism 445, such as a screw or lever or any other suitable mechanism, which raises or lowers the inner and outer input conduits 406A, 406B and/or the inner and outer output conduits 408A, 408B or the top cap 452 of the assembly 440, 442, 444, 448, 438 in outer output conduit 408A such the outputs 404A and 404B from the reaction zone 410 are raised or lowered. Alternatively, the size of the reaction zone 410 can be adjusted by replacing the reactor tubes (inlet conduits 206A, 206B and outlet conduits 208A, 208B), preferably the outer conduits 206A, 208A with reactor tubes of different length.

Figure 6:
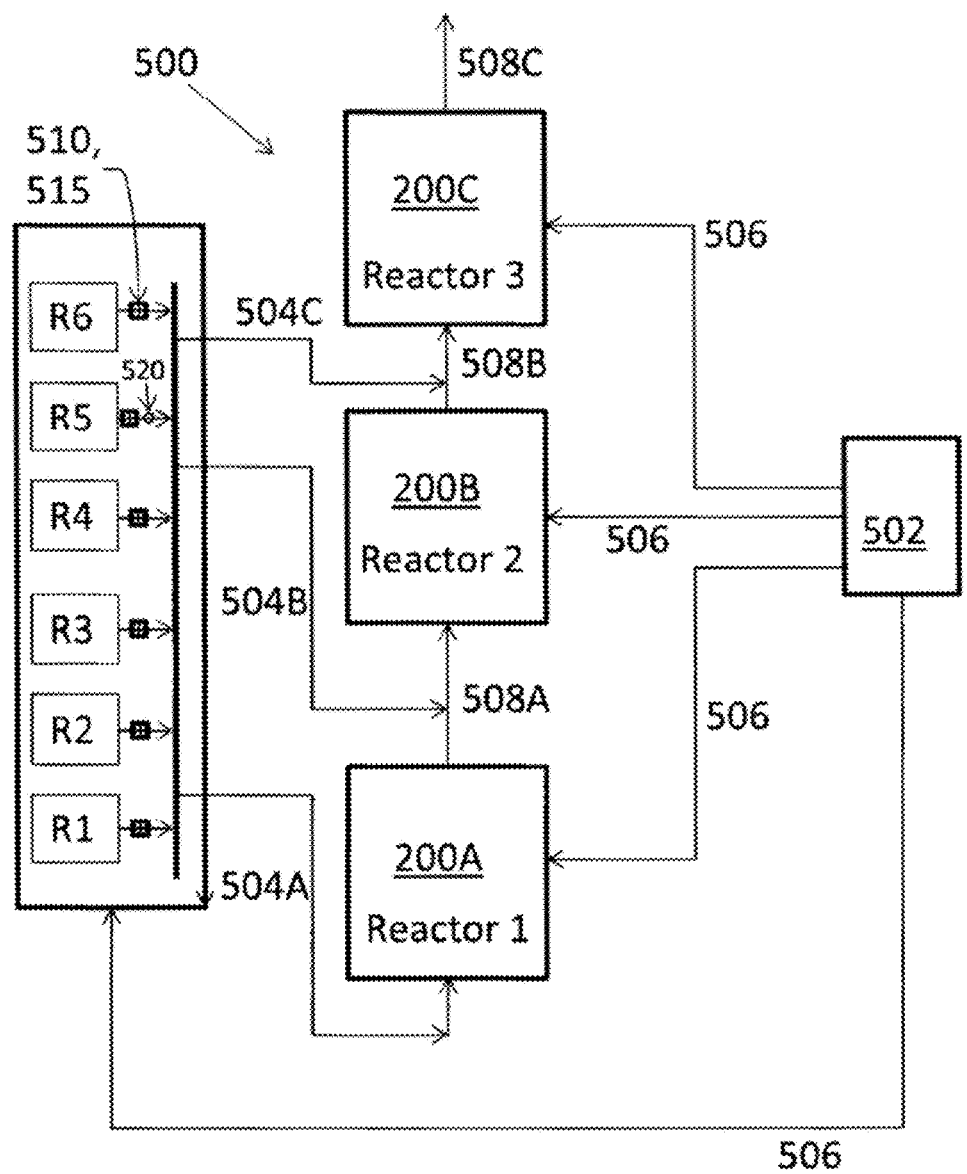
FIG. 6 is a schematic illustration of an aerotaxy™ nanowire growth system according to an embodiment.

FIG. 6 illustrates an embodiment of an aerotaxy™ nanowire growth system 500. As illustrated, the system has three aerotaxy™ nanowire growth reactors 200A, 200B, 200C according to the first embodiment. However, the system 500 may have one or more aerotaxy™ nanowire growth reactors 200, 300A, 300B, 400 of any of the previously described embodiments. As illustrated, the three aerotaxy™ nanowire growth reactors 200A, 200B, 200C are configured in series. That is, nanowires exiting the first aerotaxy™ nanowire growth reactor 200A are provided to the second aerotaxy™ nanowire growth reactor 200B and nanowires exiting from the second aerotaxy™ nanowire growth reactor 200B are provided to the third aerotaxy™ nanowire growth reactor 200C. Alternatively, as will be discussed in more detail below, the aerotaxy™ nanowire growth reactors may be configured in parallel or in a combination of series and parallel. The connections 508A, 508B between aerotaxy™ nanowire growth reactors 200A, 200B, 200C may be made with any suitable conduits, such as pipes, manifolds, hoses or any other suitable connector. The final nanowires may be harvested via conduit 508C.

In another embodiment, further separation of precursor injection can be achieved with high degree of control by using one aerotaxy™ reactor only for the pre-alloying of the catalyst particles, and the subsequent reactors for the nanowire growth. For example, only the catalyst particles and one of the precursors (e.g., the group III precursor, such as TMG) and optionally the sheath gas, are provided into the first reactor 200A to form pre-alloyed catalyst particles (e.g., group III-noble metal pre-alloyed particles, such as Ga—Au or Ga—Ag pre-alloyed particles). The pre-alloyed particles and the first precursor are then provided from the first reactor 200A into a second reactor 200B. The second precursor (e.g., group V precursor, such as $AsH_3$) and the sheath gas are also provided into the second reactor 200B to form nanowires in the second reactor using the pre-alloyed catalyst particles.

In some embodiments, for example for growing nanowires with variations in the axial (lengthwise) direction, it may be necessary to stack the consecutive growth reactors in such a way that the gas does not cool down between the growth stages, as it is known in the art of substrate-based nanowire growth that temperature cycling may lead to kink formation. In practice, this requires that the reactor sequence be built inside a single furnace. FIG. 2E shows a compact implementation of such a reactor stack, where the precursor injector lines would need to be actively cooled, e.g., using water cooling, and the inner aerosol conduit 206C and sheath gas inlet 504B1 to be actively heated, e.g., using electrical heaters.

Supplies of the sheath gas, precursor gases and catalyst aerosol may be held in reservoirs R1-R6. As illustrated, the system 500 includes six reservoirs R1-R6. However, any number of reservoirs may be included such as 2, 3, 4, 5, 6, 7, 8, 9, 10 or more as desired. The first reservoir R1 may contain, for example, a first precursor gas, such as trimethyl gallium or triethyl gallium. The second reservoir R2 may contain a second precursor gas, such as arsine or an inert carrier gas, such as nitrogen, argon or helium. The third reservoir R3 may include a second precursor gas, an inert gas (e.g. a sheath gas) or a first dopant gas having a first conductivity type. The fourth reservoir R4 may include a second dopant gas having a second conductivity type different from the first conductivity type. With this configuration, nanowires can be grown with layers (e.g. core-shell(s)) or regions of different conductivity type. Thus, as will be discussed in more detail below, both longitudinally oriented and radially oriented nanowires can be fabricated with this system. In this manner, nanowires having one or more pn or p-i-n junctions can be fabricated. Reservoir R5 may include aerosolized catalyst particles. In an embodiment, reservoir R5 includes powder catalyst particles, however the powder catalyst particles may be combined and aerosolized with a carrier gas in an aerosolizer 520. Suitable aerosol carrier gases include, but are not limited to, nitrogen, hydrogen and noble gases such as helium and argon.

Further, with this system 500, and the systems 700A, 700B discussed below, longitudinally and radially oriented nanowires having one or more pn junctions (or pin junctions) can be fabricated continuously. That is, raw materials are continuously provided at a first end of the system and finished nanowires are continuously collected at a second end of the system without having to stop the system. Additionally, because the type and concentration of the gases and the operating conditions may be independently varied in all of the reactors 200 in the system 500, both homostructures and heterostructures may be fabricated, such as with respect to composition, doping and/or conductivity type. Further, the type and concentration of the gases and the operating conditions may be varied as a function of time within a reactor 200.

In those embodiments in which catalyst particles are used, one or more reservoirs R1-R6 may contain aerosolized catalyst particles. Alternatively, one reservoir may simply include catalyst particle powder. The powder may be mixed with a precursor gas or inert gas in an aerosolizer and thereby be aerosolized prior to being provided to the reactor 200. In still another embodiment, a catalyst particle aerosol is generated by generating catalyst particles, e.g. by evaporation of gold, in an aerosolizer and combining the catalyst particles with a gas in the aerosolizer.

The gases and optional catalyst aerosol are provided to the reactors 200A, 200B, 200C with feed conduits 504A, 504B, 504C which connect outputs to inputs of adjacent reactors. The feed conduits may be a pipe, conduit, hose, manifold or any other suitable delivery tube. As discussed above, the temperature of the reactors 200A, 200B, 200C can be monitored with one or more thermocouples 420. Additionally, the gas or aerosol flow from the reservoirs R1-R6 to the reactors 200A, 200B, 200C may be monitored with mass flow indicators 510. Data from the thermocouples 420 and the mass flow indicators/controllers 510 may be sent to a controller 502, such as a personal computer, server, or special purpose computing device. The data may be sent via wires 506 or may be sent wirelessly with the use of wireless transceivers. In an embodiment, the controller 502 includes software which can analyze the data and send feedback instructions to the heaters 214, 216 and/or to gas flow controllers 515 of reservoirs R1-R6 (e.g. computer controllable flow control valves) to increase or decrease the temperature in the reactors 200 or to increase or decrease the flow of the aerosol or gases to the reactors 200.

FIGS. 7A and 7B illustrate additional embodiments of aerotaxy™ nanowire growth systems 700A, 700B. In this embodiment, the system 700A includes a first reservoir R1 configured to deliver a precursor gas to the reactor 200 (or 300, 400). Optionally, the precursor gas may include catalyst particles delivered from an aerosol reservoir. The system 700A also includes a second reservoir R2 configured to deliver a sheath gas. The sheath gas may be a second precursor gas or an inert gas, e.g. nitrogen or a noble gas such as helium or argon. The system 700A further includes a particle analyzer 704 which provides in-situ analysis of the nanowires or the partly grown nanowires to obtain the desired nanowire properties. The particle analyzer 704 may operate, for example, by illuminating the nanowires and detecting the luminescence from the nanowires to determine optical properties of the nanowires. In-situ analysis provides the ability to obtain feed-back in a control loop that is not available in substrate-based synthesis of nanowires. The feed-back may be used to control wire growth, such as by controlling the size of the catalytic seed particles, as well as control of growth conditions by controlling one or more parameters associated with: precursor composition, precursor molar flow, carrier gas flow, temperature, pressure or dopants, in one or more of the reaction zones. After nanowire growth, the nanowires are provided to a nanowire repository 706 (e.g. a container for storage of the nanowires or a nanowire deposition apparatus containing a substrate).

In the embodiment illustrated in FIG. 7B, the system 700B includes a first reservoir R1 and a second reservoir R2. The first reservoir R1 may be configured to provide a precursor gas and the second reservoir R2 configured to provide a sheath gas. In this embodiment, the system 700B includes a plurality of reactors 200 configured in series and parallel. With this system 700B, a large number of nanowires may be fabricated simultaneously. Further, each parallel line of reactors 200 may be operated under different conditions from the other conduits of reactors 200 in the system 700B. In this manner, different configurations of nanowires, e.g. longitudinally oriented and horizontally oriented, may be produced simultaneously. In another aspect, different conduits of reactors 200 may be provided with different size nanoparticles. In this manner, nanowires having different diameters may be fabricated at the same time without being comingled. Optionally, the system 700B illustrated in FIG. 7B may include one or more particle analyzers 704 to monitor the nanowire growth in one or more of the conduits of reactors 200.

The nanowire growth apparatuses 200, 200A, 200B, 300A, 300B, 400 may be aligned horizontally or vertically, (e.g. for a vertical alignment of a nanowire growth apparatuses 200, the outer input 202A and the inner input 202B are vertically aligned with the outer output 204A and inner output 204B, respectively). In systems 500, 700A, 700B, with multiple nanowire growth apparatuses 200, 200A, 200B, 300A, 300B, 400, the nanowire growth apparatuses 200, 200A, 200B, 300A, 300B, 400 may be vertically stacked.

Figure 8A:
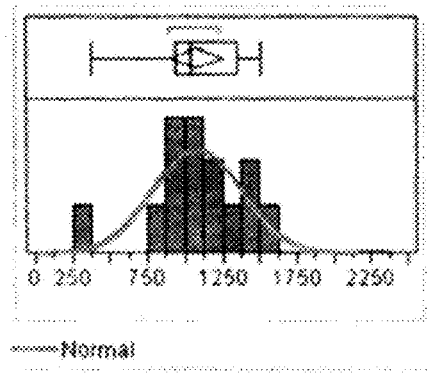
FIG. 8A is a histogram illustrating the distribution of nanowire lengths made with the apparatus of FIG. 1.
Figure 8B:
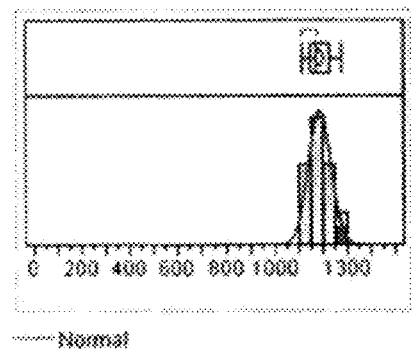
FIG. 8B is a plot of simulated distribution data for the apparatus of FIG. 2.
Figure 8C:
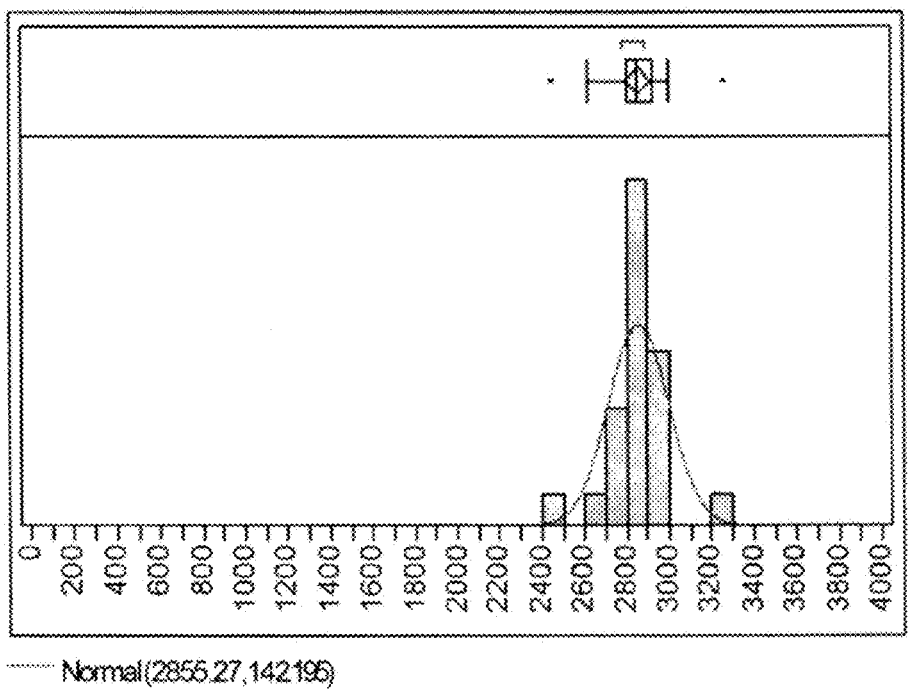
FIG. 8C is a plot of actual distribution data for nanowire grown in a reactor realized according to FIG. 2A.

FIGS. 8A and 8B provide a comparison of the size distribution of nanowires fabricated in the prior art reactor 100 of FIG. 1 with nanowires fabricated in the reactor 200 of the embodiment of the invention illustrated in FIG. 2. The curved line in FIG. 8A illustrates the size distribution assuming laminar flow in the reactor 100. The histogram illustrates the distribution of measurements of actual nanowires made with the reactor 100. FIG. 8B is a plot of simulated distribution data for the reactor 200 of FIG. 2 operated under the same conditions as the reactor 100 used to generate the data in FIG. 8A, assuming that wire length is linearly proportional to the time each particle/wire spends in the reaction zone. FIG. 8C is a plot of actual distribution data for nanowire grown in a reactor 200 illustrated in FIG. 2A and described above, with core aerosol and sheath flows of 500 and 1200 sccm, respectively; with system at atmospheric pressure; and at a reaction temperature of 500° C. The nanowires produced by the reactor 100 have a much wider size distribution than the nanowires produced by the reactor 200. The standard deviation of the length distribution formed by the reactor 100 is approximately 30% of the value of the mean nanowire length, in the worst case assumption of fully developed laminar flow throughout the reactor 200. The simulated standard deviation (FIG. 8B) of the length distribution formed by the reactor 200 is for example, less than or equal to 5%, such as 3-5%, for example approximately 3%, of the value of the mean nanowire length; the measured standard deviation of the length distribution (FIG. 8C) is 5% of the of the value of the mean nanowire length. Thus, the standard deviation of the nanowire lengths produced by the reactor 200 in this example is at least 10 times smaller than the standard deviation of the nanometer lengths produced by the reactor 100.

Figure 9A:
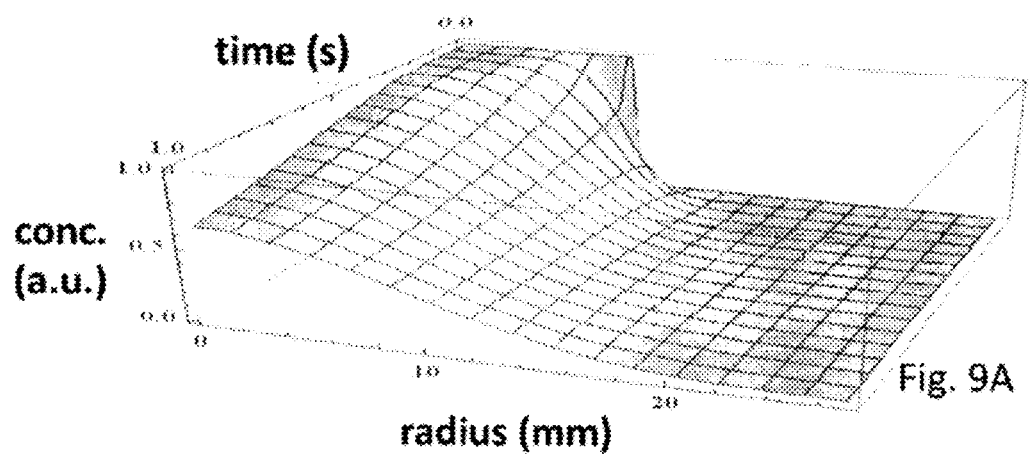
FIGS. 9A is a simulation illustrating the diffusion speed of trimethyl gallium; 9B is a simulation illustrating the diffusion speed of 50 nm Au particles for 1 second and 9C is a simulation illustrating the diffusion speed of 50 nm Au particles for 200 seconds.
Figure 9B:
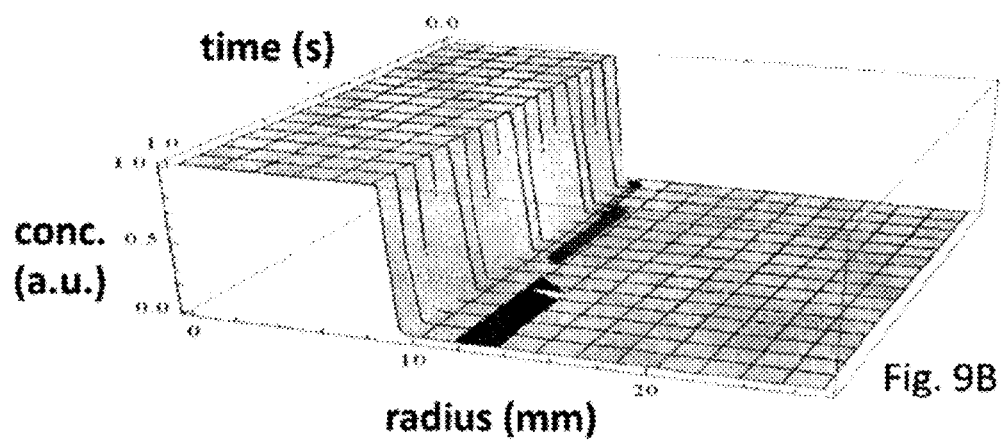
Figure 9C:
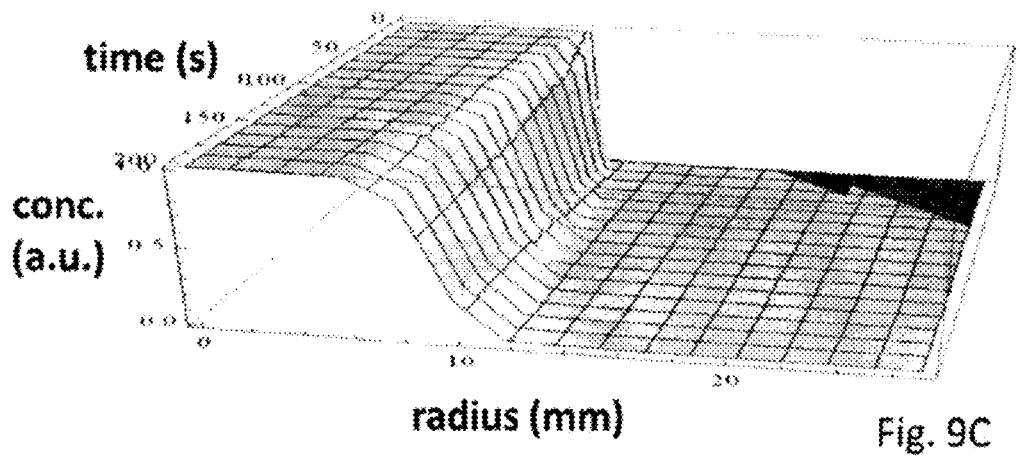

Simulations were conducted to determine the amount of interdiffusion of the concentric gas flows in the reactor 200. The results of these simulations are presented in FIGS. 9A-9C. FIGS. 9A-9C illustrate simulated plots of concentration versus distance (reactor radius) for the diffusion of trimethyl gallium (TMG), 50 nm Au particles for 1 second and 50 nm Au particles for 200 seconds, respectively provided in an inner input 202B of a reactor 200. The simulations are based on a reactor 200 in which the inner input 202B has a radius of 9 mm and the outer input 202A has a radius of 27 mm. The diffusion coefficient used for TMG was $1.98 \times 10^{-5}$ m$^2$/s and the diffusion coefficient for the 50 nm Au particles was $3.28 \times 10^{-9}$ m$^2$/s. For these simulations, diffusion was the only mixing mechanism. That is, turbulence, mixing and convection were set to zero in the simulation.

As can be seen in FIG. 9A, the simulated TMG began to diffuse laterally into the sheath gas after approximately 0.2 seconds. By 1.0 second, the concentration of TMG in the center of the inner input 202B had dropped from 100% to 70%. The concentration in the sheath gas adjacent the inner input 202B, e.g. at a radius of 10 mm, has risen from 0% to approximately 30%. In contrast, the gold particles, because of their much lower diffusion coefficient, have barely diffused into the sheath, even after 20 seconds. Thus, the gold particles exhibit good plug flow for a wide range of reactor lengths and are well contained by the sheath flow.

Embodiments of the invention also include methods for forming nanowires that allow for large scale production combined with a structural complexity and material quality comparable to nanowires formed using substrate-based synthesis. One method includes providing a first gas to the first input conduit to a reaction chamber, such as a tube furnace. In this method, the first gas preferably includes a first precursor material for fabricating the nanowires. For example, the first gas may be trimethyl gallium (TMG) which dissociates into gallium and methane at elevated temperatures, thereby providing gallium for gallium based nanowires, such as semiconducting GaAs nanowires. A second gas is provided to the reaction zone of the reaction chamber through the first input. The second gas may comprise a second, different precursor, such as arsine which dissociates into arsenic and hydrogen. In this embodiment, the gallium forms droplets which catalyze the dissociation of arsine and the growth of the GaAs nanowire. The sheath gas is provided through the second input; optionally, catalyst particles are provided through the first input.

Figure 10:
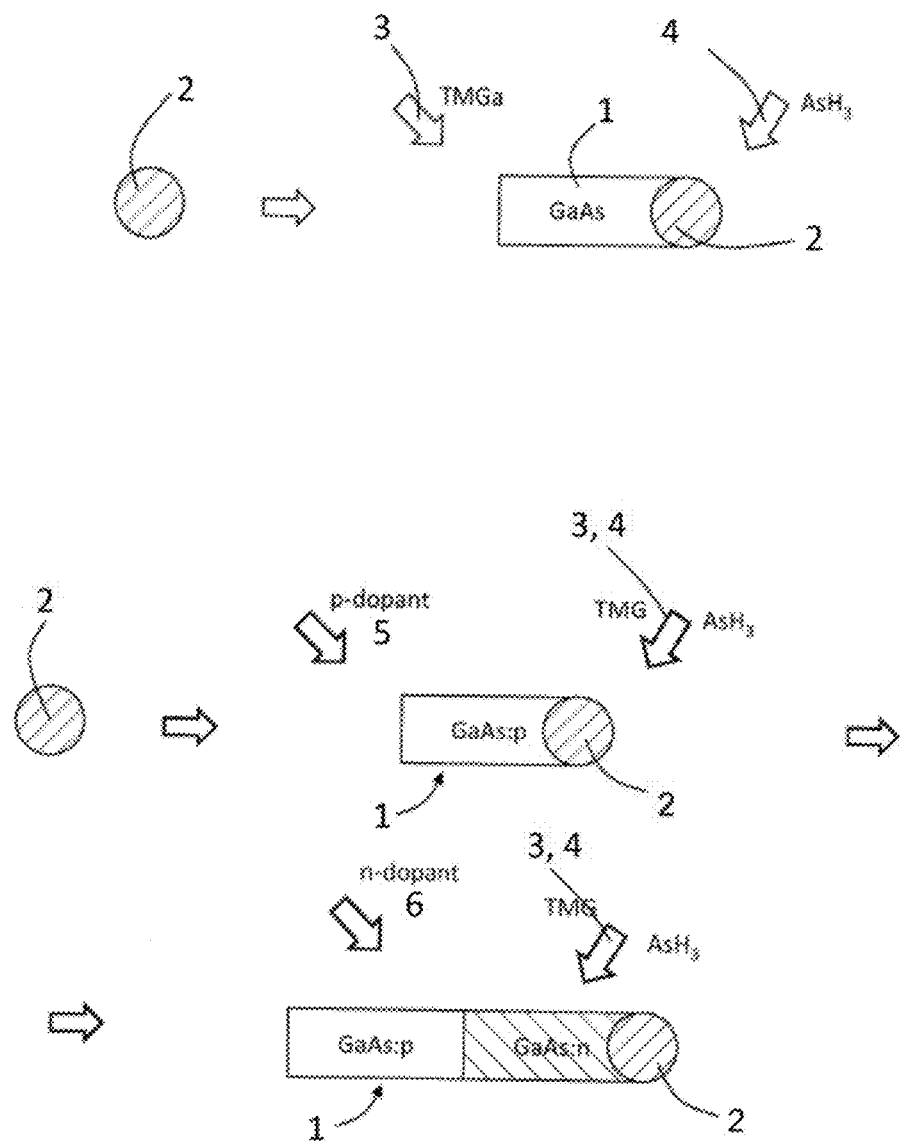
FIG. 10 is a schematic illustration of axial growth a nanowire comprising a pn junction according to an embodiment.

FIG. 10 is a schematic illustration of axial growth a nanowire 1 comprising a pn junction according to an embodiment. The method includes providing catalytic particles 2 suspended in a gas and providing first and second gaseous precursors 3, 4, e.g. TMG and AsH$_3$, that include constituents of the nanowires 1 to be formed into a reaction zone. The method also includes growing single crystal nanowires 1 from the catalytic particles 2 in a gas-phase synthesis which includes the first and second gaseous precursors 3, 4 while the catalytic particles are suspended in the gas(es). The first and second precursor gases 3, 4 may be provided to the reactor 200 at room temperature. Alternatively, the first and second precursor gases 3, 4 (as well as the dopant gases if used) may be pre-heated prior to delivery to the reactor 200.

Nanowire growth is performed at an elevated temperature in any of the reactors 200, 300, 400 as described above. Growth is initiated by catalytic decomposition of the gaseous precursors 3, 4 on the surface of the catalytic particles 2 and nucleation of the nanowire on the surface of the catalytic particles 2. After nucleation, the nanowire 1 grows directionally and forms an elongated object, i.e. a nanowire 1. Growth may occur via vapor-liquid-solid (VLS) or chemical vapor deposition (CVD). Preferably, the gas flows through the reactor and thereby carries at least the catalytic particles 2 and thus the nanowires 1 formed on the catalytic particles 2 through the reactor.

The methods as described herein are described in terms of semiconductor materials, in particular III/V-materials. However, the methods are not limited to III-V materials. By way of example, FIG. 10 schematically illustrates the formation of a GaAs wire 1 from a catalytic particle 2, such as gold, and first and second gaseous precursors TMG 3 and AsH$_3$ 4. As shown, the catalytic particles 2 are carried forward by a feed gas into a reactor where the gaseous precursors 3, 4 are present and the reaction takes place. Alternatively, the precursor gases 3, 4 may be added to the gas flow prior to entering the reactor or directly to the reactor. For example, as discussed above, the catalytic particles may be aerosolized in one of the precursor gases 3, 4 and added to the reactor via the inner input conduit 206B in the reactor 200 or via the inner input conduit 306C or the middle input conduit 306B in the reactor 300A.

FIG. 10 further schematically illustrates how a method of the invention can be used to form a GaAs nanowire 1 with an axial pn-junction between a p-doped GaAs segment and an n-doped GaAs segment. First and second precursors 3, 4 having group III material and group V material, respectively, and one or more p-dopants are provided to a reactor 200. After nucleation, a p-doped GaAs nanowire 1 is axially grown from the catalytic particle 2, thereby forming a first axial segment of the GaAs nanowire. Thereafter, the growth conditions are changed by exchanging the p-dopant with an n-dopant, while substantially maintaining other parameters related to the growth conditions, such that a second axial wire segment is axially grown on the previously formed first segment in a longitudinal direction. Thus, by varying the growth conditions during axial growth, axial segments with different properties can be obtained.

Figure 11:
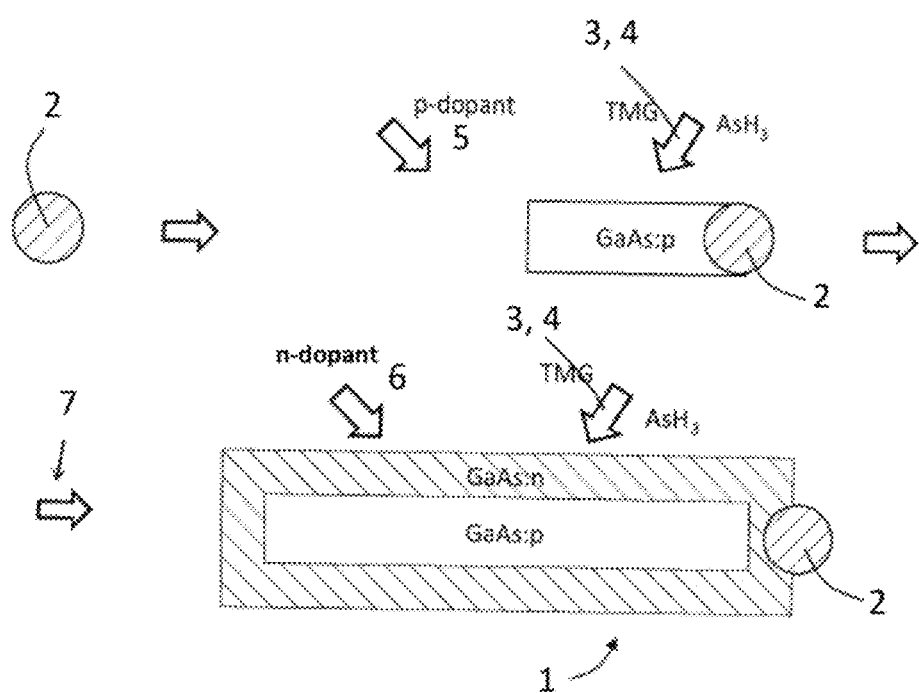
FIG. 11 is a schematic illustration of radial/core-shell growth a nanowire comprising a pn junction according to an embodiment.

FIG. 11 schematically illustrates the formation of a GaAs nanowire having a radial pn-junction between a p-doped GaAs core and an n-doped GaAs shell. First and second precursors 3, 4 comprising group III material and group V material, respectively, and p-dopants are provided to the reactor. After nucleation, p-doped GaAs is axially grown from the catalytic particle 2, thereby forming the core of the GaAs nanowire 1. Thereafter the growth conditions are changed by increasing the temperature and/or the V/III-ratio to promote radial growth and by exchanging the p-dopant to an n-dopant. Thereby the shell is radially grown on the previously formed core in a radial direction thereof. This illustrates the possibility to vary the growth conditions to switch between axial growth and radial growth. Alternatively, the nanowire by grown with an n-doped core and a p-doped shell.

Figure 12:
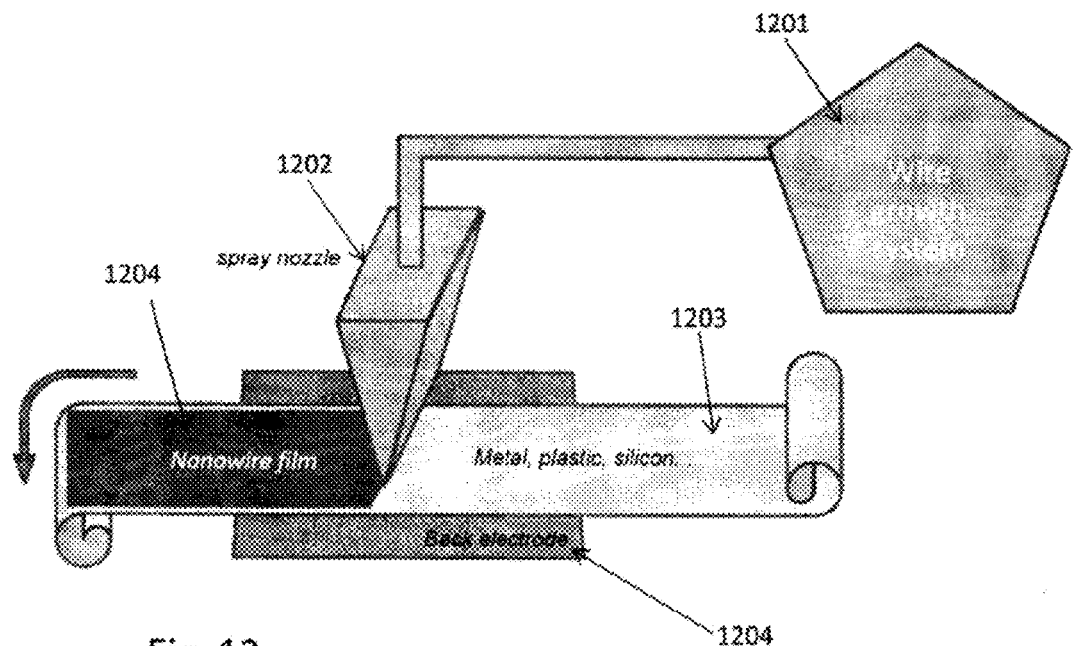
FIG. 12 is a schematic illustration of a method of depositing aerotaxially grown nanowires on a substrate.

In any of the above methods of fabricating nanowires, the nanowires may be collected upon the completion of growth and then deposited as a film on a substrate and/or oriented in a preferred orientation on a substrate (e.g., with the nanowire axis substantially normal to the substrate surface supporting the nanowires). FIG. 12 illustrates a method of depositing nanowires on a substrate while FIG. 13 illustrates a method of depositing and orienting nanowires on a substrate.

In the method illustrated in FIG. 12, nanowires are collected from the aerotaxy™ growth system 200, 300, or 400 into a storage reservoir 1201 and then provided from the reservoir to a spray nozzle 1202. Alternatively, the nanowires may be provided directly from the system 200, 300, or 400 (e.g., via exhaust 442) to the nozzle 1202 without being stored in the reservoir 1201. The spray nozzle sprays the nanowires onto a substrate 1203, such as sheet of metal, e.g. stainless steel, plastic, silicon or any other suitable material to form a nanowire film 1204, such as percolating network of nanowires, on the substrate.

Figure 13:
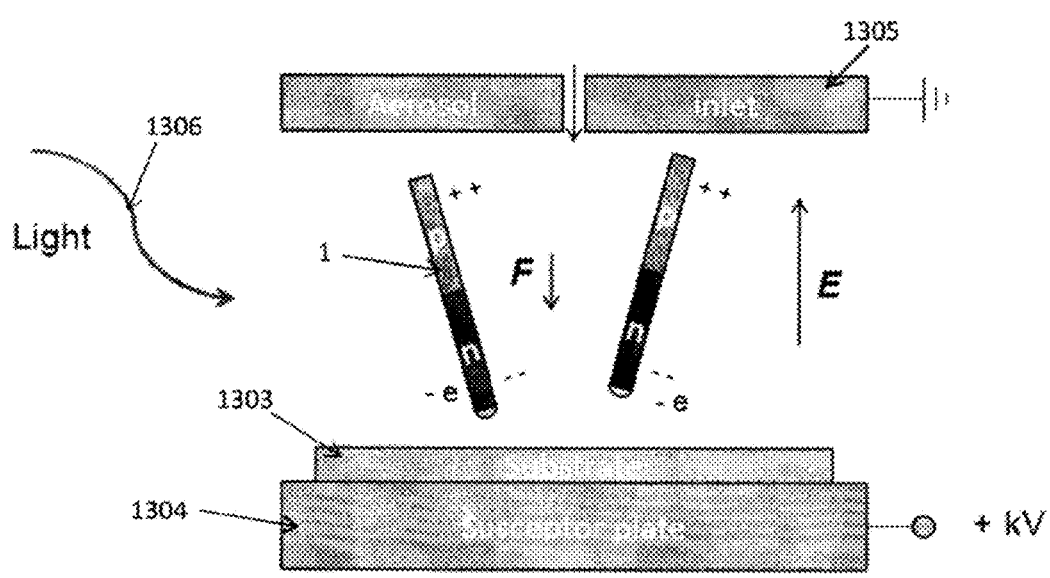
FIG. 13 is a schematic illustration a method of orienting nanowires on a substrate.

In FIG. 13, the nanowires 1 are aligned with their long axis perpendicular to the substrate 1303 using an electric dipole generated in the nanowires by an electric field in the deposition chamber 1300. For example, an electric field, E, may be generated in the deposition chamber by a potential difference (i.e., voltage) applied between a susceptor 1304 supporting the substrate and a top plate 1305 above the substrate having an aerosol inlet. The nanowires are provided from the reservoir or directly from the reactor shown in FIGS. 2-4 as an aerosol into the deposition chamber 1300.

The electric dipole in the nanowires can, by way of example, be generated by one or a combination of the following:
1. An electric field will induce an electric polarization in any conducting, semiconducting or insulating nanowire, and the nanowires will orient themselves along the electric field.
    a. For unipolar nanowires, the nanowire will be oriented along the electrical field, but with no preferred direction for a seed particle end.
    b. A unipolarly doped nanowire with an axial gradient in the doping will be preferentially oriented, since the more highly p(n)-doped end will be more easily charged positively (negatively), directing this end up (down) in the electric field.
2. A nanowire comprising a p-doped end and an n-doped end forming a pn-junction in-between will be more easily polarizable than an unipolar nanowire, as shown in FIG. 13.
    a. The p-doped end will become positively charged and the n-doped end will be negatively charged when exposed to the electrical field, and hence the nanowire will be oriented in an unequivocal direction with the p-doped end pointing in the direction of the electric field (e.g., up in FIG. 13).
    b. The same effect will apply to a unipolarly doped nanowire where a Schottky diode is formed between the wire and its seed particle.
3. Illumination of a nanowire containing a pn-junction with light or UV or IR radiation 1306 may also induce a strong electric dipole with the same polarity as the electric dipole formed by the electric field, greatly enhancing the effect of the pn-junction itself, as shown in FIG. 13.

By illumination with light in different pre-determined wavelength regions, nanowires having different band gaps can be selectively aligned since wires that do not absorb the light will have a much weaker dipole.

In an alternative embodiment, rather than using an electric dipole to align the nanowires, other suitable methods may be used to align the nanowires. For example, the nanowires may be aligned using a chemical surface modification method, where the nanowires are selectively functionalized to align them on a substrate, as described in U.S. provisional application Ser. No 61/623,137 filed in Apr. 12, 2012 and in corresponding PCT application PCT/SE2013/050389, both of which are incorporated herein by reference in their entirety.

Although exemplified with GaAs, it should be appreciated that other III/V semiconductor materials as well as semiconductor materials comprising group II and group VI materials may be processed in the same way. For example the gaseous precursors of the above examples can be exchanged for trimethyl indium (TMIn) and phosphine ($PH_3$) to form InP wires. Nanowire materials that can be made by the systems and method disclosed herein include, but are not limited to, GaAs, InP, Ga, $Ga_xIn_{1-x}As_yP_{1-y}$, $Al_xGa_{1-x}As_yP_{1-y}$, GaSb, $Ga_xIn_{1-x}As_ySb_{1-y}$, GaN, InN, AlN, $Al_zGa_xIn_{1-x-z}N$, InGaN, Si, SiC, Ge or $Si_xGe_{1-x}$, where $0 \le x \le 1$, $0 \le y \le 1$ and $0 \le z \le 1$ and $x+y+z=1$. The reactor configuration does not have to be changed to form wires from different gaseous precursors, the gaseous precursors are simply switched, e.g. in the systems 500, 700A, 700B. Moreover, the processes such as those exemplified by FIGS. 10 and 11 may be performed with or without the addition of dopants. Insulators may also be grown. Single or multiple reactors or reaction zones within a reactor can be used to improve the formation of segments, cores or shells having different composition, doping or conductivity type. Moreover, axial and radial growth is not necessarily fully decoupled, process conditions may be selected such that the nanowires grow both radially and axially at the same time. By choosing appropriate gaseous precursor, flows, temperatures, pressures, and particle sizes, the nanowire material can be made to grow in the axial or radial direction, or in a combination of the two growth modes. Sheath gases include, but are not limited to, nitrogen, hydrogen and noble gases such as helium and argon. Precursor gases include but are not limited to TMG, TMIn, TEG, TEIn, TMAl, TEAl, $NH_3$, $AsH_3$ and $PH_3$. Suitable dopants depend on the nanowire material being doped. Examples, include, but are not limited to: (1) InGaAl-AsPSb: n-dopants: S, Se, Si, C, Sn; p-dopants: Zn, Si, C, Be; (2) AlInGaN: n-dopants: Si; p-dopants: Mg; (3) Si: n-dopants: P, As, Sb; p-dopants: B, Al, Ga, In; (4) CdZn-OSSeTe system: p-dopants: Li, Na, K, N, P, As; n-dopants: Al, Ga, In, Cl, I.

In an embodiment of the method, a reactor 200 having an inner input 202B located concentrically within the outer input 202A is used to overcome the wall effects of the earlier gas methods of nanowire growth discussed above. With this configuration, a first gas and a second gas may be provided to the reaction chamber such that second gas forms a sheath separating the first gas from the wall of the reaction chamber. In this manner, the first, inner gas is shielded from the detrimental effects of the temperature gradients and viscous effects caused by the walls. Preferably, both the first gas and the second gas are provided with laminar flow. By means of diffusion, the gas carrying the catalytic particles and/or nanowires is substantially exchanged for the sheath gas in embodiments where the core and sheath gases are different. This may be advantageous for optimizing different chemical reactions in sequential reactor sections 200A, 200B, etc.

In an alternative embodiment, catalytic seed particles 2 may be provided with the first precursor gas 3 and optionally the second precursor gas 4 in the first, inner input 202B as a common inner gas stream. The catalyst seed particles may be aerosolized in the first precursor gas 3 or separately aerosolized in a different gas and added to the first, inner input. In an embodiment, the second gas includes a second precursor gas 4. In an alternative embodiment, the second gas may be an inert gas such as nitrogen, argon or helium. In an embodiment, the first gas includes only one precursor gas 3, such as silane, which dissociates into silicon and hydrogen while the second gas is inert. In this embodiment, single element nanowires, such silicon nanowires, may be grown. In an aspect of this embodiment, one or more dopant gases (e.g. $PH_3$ or $AsH_3$ for n-type doping and $B_2H_2$ for p-type doping) may be included in the first gas. In this manner, a doped, "single element" nanowire may be produced.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of fabricating semiconductor nanowires comprising:
    providing a first gas stream to a reaction chamber, wherein the first gas stream comprises a first precursor for fabricating the semiconductor nanowires; and
    providing a second gas stream to the reaction chamber, wherein the second gas stream forms a sheath separating the first gas stream from a wall of the reaction chamber, wherein the first gas stream has a velocity that is higher than the second gas stream to result in an expansion in a diameter of the first gas stream;
    providing nanowire growth catalyst particles;
    wherein the semiconductor nanowires comprise single crystal III-V or II-VI semiconductor nanowires.

2. The method of claim 1, wherein the nanowire growth catalyst particles are provided from an aerosol in at least one of the first gas stream or the second gas stream.

3. The method of claim 2, wherein:
    the nanowire growth catalyst particles are provided from an aerosol in the first gas stream; and
    the first gas stream containing the catalyst particles flows sequentially through one or more reaction zones of the reaction chamber such that the semiconductor nanowires grow from the catalyst particles and the semiconductor nanowires grown after passage through the reaction zones are carried by the first gas stream surrounded the second gas stream sheath.

4. The method of claim 1, wherein the sheath gas comprises nitrogen, hydrogen or a noble gas.

5. The method of claim 1, wherein the noble gas comprises helium or argon.

6. The method of claim 1, wherein the semiconductor nanowires comprise the single crystal III-V semiconductor nanowires.

7. The method of claim 6, wherein the single crystal III-V semiconductor nanowires comprise GaP nanowires.

8. The method of claim 1, wherein the semiconductor nanowires comprise the single crystal II-VI semiconductor nanowires.

* * * * *